United States Patent
Saito et al.

(10) Patent No.: US 9,865,839 B2
(45) Date of Patent: Jan. 9, 2018

(54) DISPLAY UNIT WITH MOISTURE PROOF FILM OUTSIDE OF SEAL SECTION AND ELECTRONIC APPARATUS WITH SAID DISPLAY UNIT

(71) Applicant: JOLED INC., Tokyo (JP)

(72) Inventors: Takatoshi Saito, Kanagawa (JP); Kenichi Izumi, Kanagawa (JP); Shinichi Teraguchi, Kanagawa (JP); Tadakatsu Nakadaira, Kanagawa (JP); Mikihiro Yokozeki, Kanagawa (JP); Shota Nishi, Kanagawa (JP); Manabu Kodate, Kanagawa (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/416,518

(22) PCT Filed: Jul. 30, 2013

(86) PCT No.: PCT/JP2013/004606
§ 371 (c)(1),
(2) Date: Jan. 22, 2015

(87) PCT Pub. No.: WO2014/020899
PCT Pub. Date: Feb. 6, 2014

(65) Prior Publication Data
US 2015/0207100 A1    Jul. 23, 2015

(30) Foreign Application Priority Data

Jul. 31, 2012  (JP) ................................. 2012-170618
Aug. 8, 2012  (JP) ................................. 2012-176507

(51) Int. Cl.
*H01L 51/52*    (2006.01)
*H01L 27/32*    (2006.01)

(52) U.S. Cl.
CPC ...... *H01L 51/5253* (2013.01); *H01L 27/3244* (2013.01); *H01L 51/524* (2013.01); *H01L 51/5237* (2013.01); *H01L 51/5246* (2013.01)

(58) Field of Classification Search
CPC ..................... H01L 51/5237; H01L 51/5253
See application file for complete search history.

(56) References Cited

U.S. PATENT DOCUMENTS 7,776,641 B2 * 8/2010 Rhee .................. H01L 27/3244
                                                            257/93
8,541,779 B1 * 9/2013 Chen ....................... H01L 29/08
                                                            257/40

(Continued)

FOREIGN PATENT DOCUMENTS

EP       1492390       12/2004
JP    2002-093576       3/2002

(Continued)

OTHER PUBLICATIONS

PCT International Search Report issued in connection with related PCT/JP2013/004606 dated Nov. 2, 2014.

(Continued)

*Primary Examiner* — Thao X Le
*Assistant Examiner* — Xia Cross
(74) *Attorney, Agent, or Firm* — Dentons US LLP

(57) ABSTRACT

A display unit including a first substrate and a second substrate that are disposed to face each other, a first organic insulating layer on the first substrate, a plurality of light-emitting elements arrayed in a display region, the display region on the first organic insulating layer and facing the second substrate and a first moisture-proof film covering the first organic insulating layer in a peripheral region, in which the peripheral region is provided on the first substrate and surrounds the display region.

18 Claims, 30 Drawing Sheets

FIG. 1A

(56) References Cited

U.S. PATENT DOCUMENTS

| | | | |
|---|---|---|---|
| 2002/0024096 A1 | 2/2002 | Yamazaki et al. | |
| 2002/0180371 A1* | 12/2002 | Yamazaki | H01L 27/3246 |
| | | | 315/169.3 |
| 2003/0117068 A1 | 6/2003 | Forest et al. | |
| 2004/0012870 A1 | 1/2004 | Nishikawa et al. | |
| 2004/0185301 A1 | 9/2004 | Tsuchiya et al. | |
| 2005/0016462 A1* | 1/2005 | Yamazaki | C23C 14/12 |
| | | | 118/726 |
| 2005/0023974 A1* | 2/2005 | Chwang | H01L 51/5237 |
| | | | 313/512 |
| 2005/0052348 A1* | 3/2005 | Yamazaki | G02B 27/01 |
| | | | 345/44 |
| 2006/0006424 A1* | 1/2006 | Yamazaki | H01L 29/66757 |
| | | | 257/222 |
| 2006/0033429 A1 | 2/2006 | Fujimura et al. | |
| 2007/0164675 A1* | 7/2007 | Amano | H01L 27/1214 |
| | | | 313/512 |
| 2009/0153042 A1 | 6/2009 | Izumi | |
| 2011/0062435 A1* | 3/2011 | Yamazaki | H01L 29/7869 |
| | | | 257/43 |
| 2011/0163330 A1 | 7/2011 | Kim et al. | |
| 2011/0210348 A1 | 9/2011 | Yuasa | |
| 2012/0132903 A1* | 5/2012 | Yamazaki | H01L 21/0242 |
| | | | 257/43 |

FOREIGN PATENT DOCUMENTS

| | | |
|---|---|---|
| JP | 2002-151253 | 5/2002 |
| JP | 2002-324666 | 11/2002 |
| JP | 2003-323125 | 11/2003 |
| JP | 2003-347044 | 12/2003 |
| JP | 2006-054111 | 2/2006 |
| JP | 2008-283222 | 11/2008 |
| JP | 2011-138635 | 7/2011 |
| WO | 2011-108020 | 9/2004 |
| WO | 2004-057920 | 8/2011 |

OTHER PUBLICATIONS

European Patent Office Action corresponding to European Serial No. 13753911.0 dated Aug. 2, 2016.
Japanese Patent Office Action corresponding to Japanese Serial No. 2012-176507 dated May 31, 2016.

* cited by examiner

[Fig. 1]
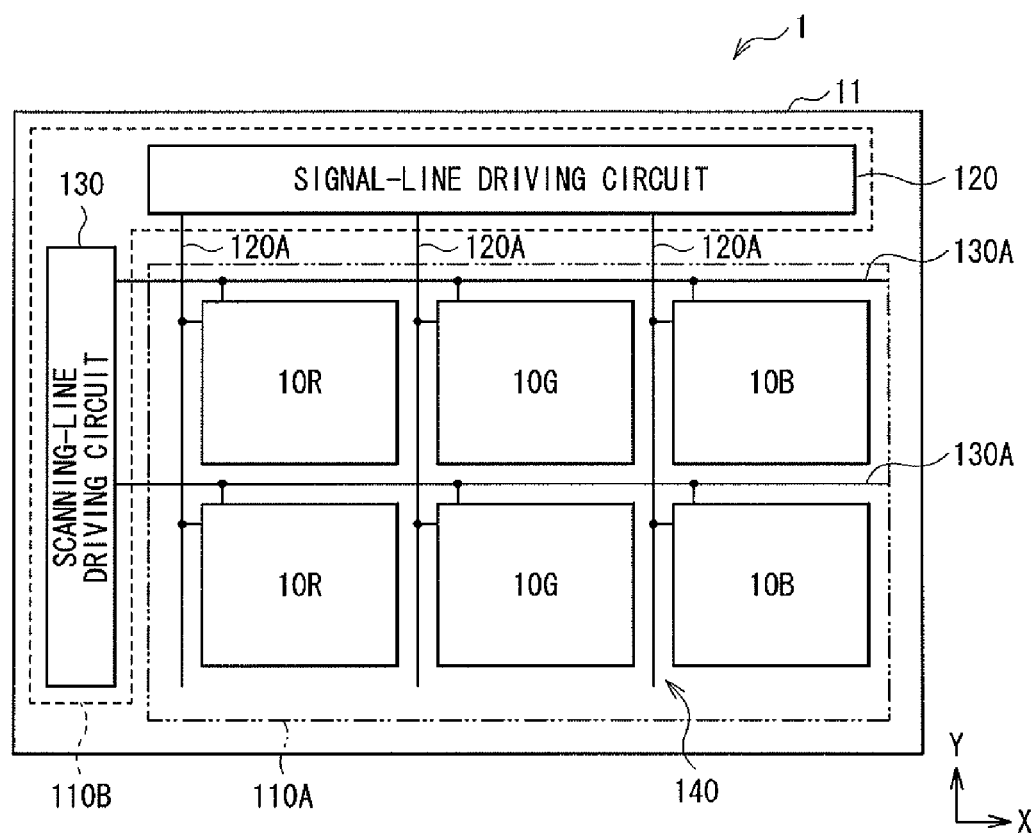
[Fig. 2]
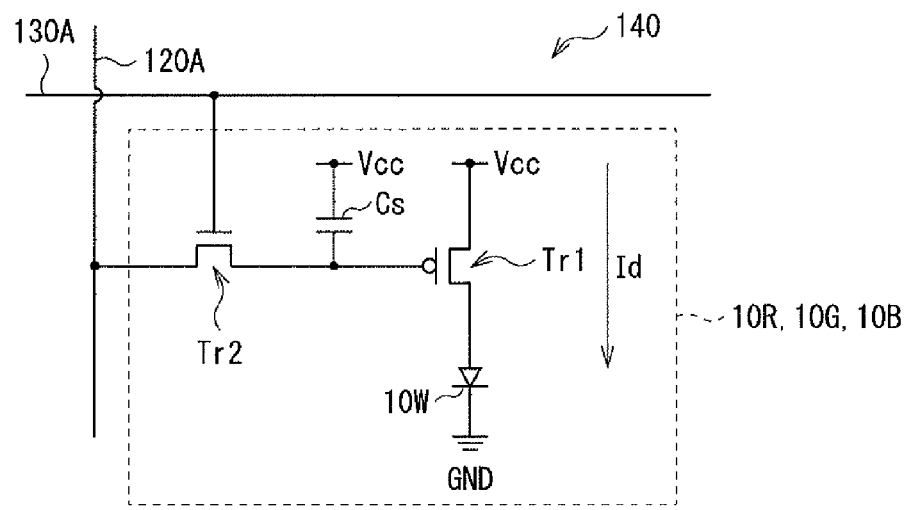

[Fig. 3]
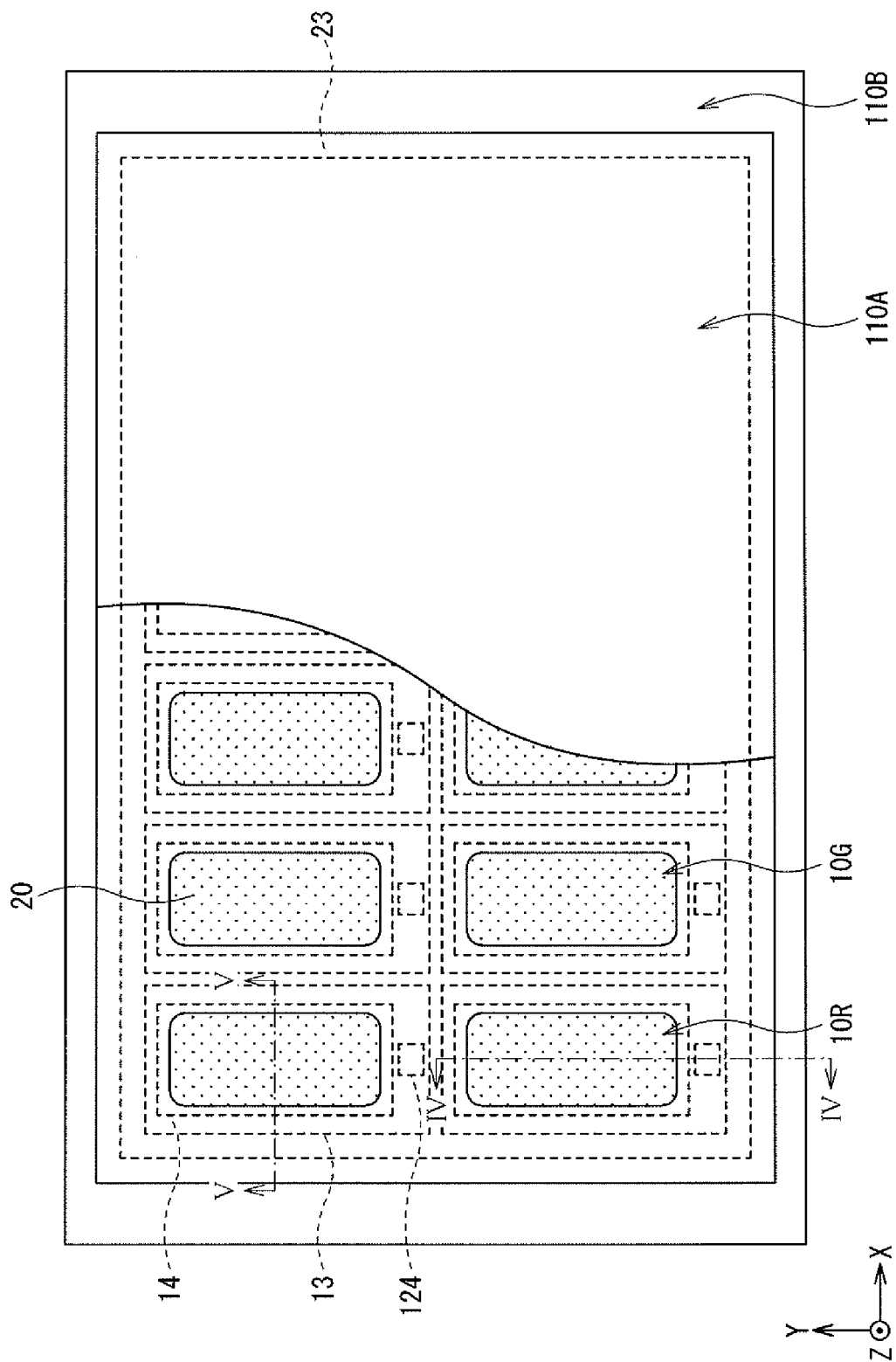

[Fig. 4]
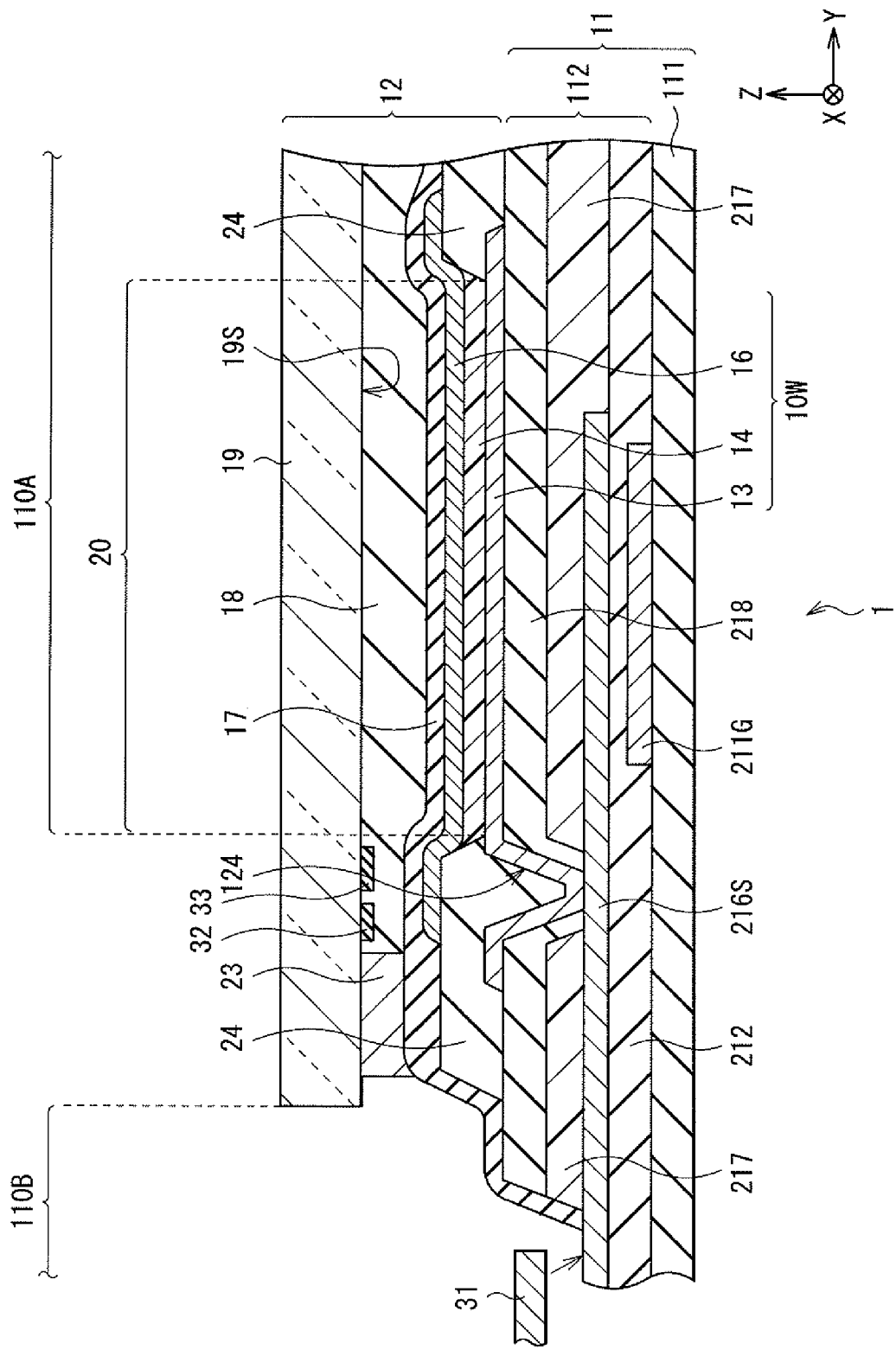

[Fig. 5]
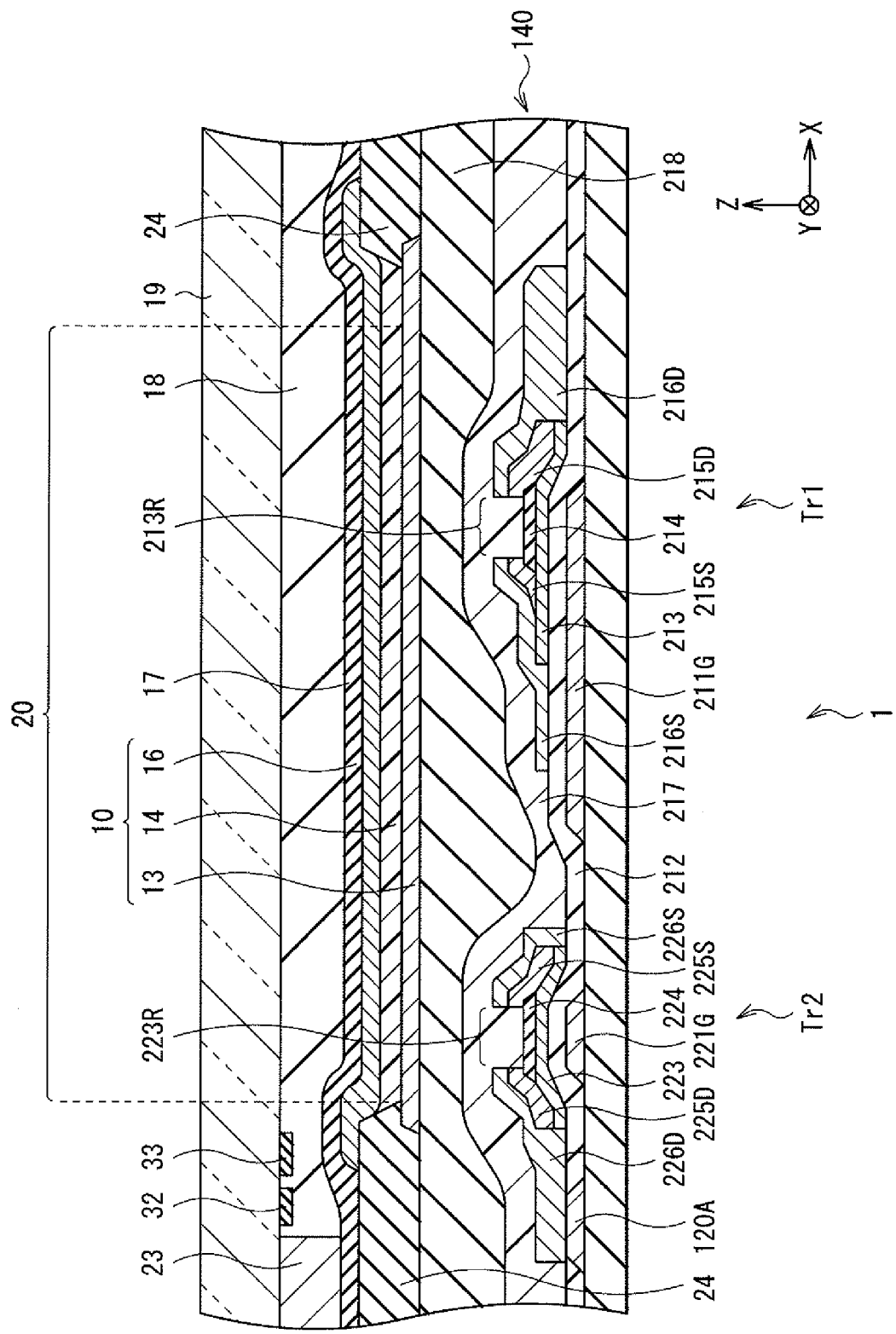

[Fig. 6]
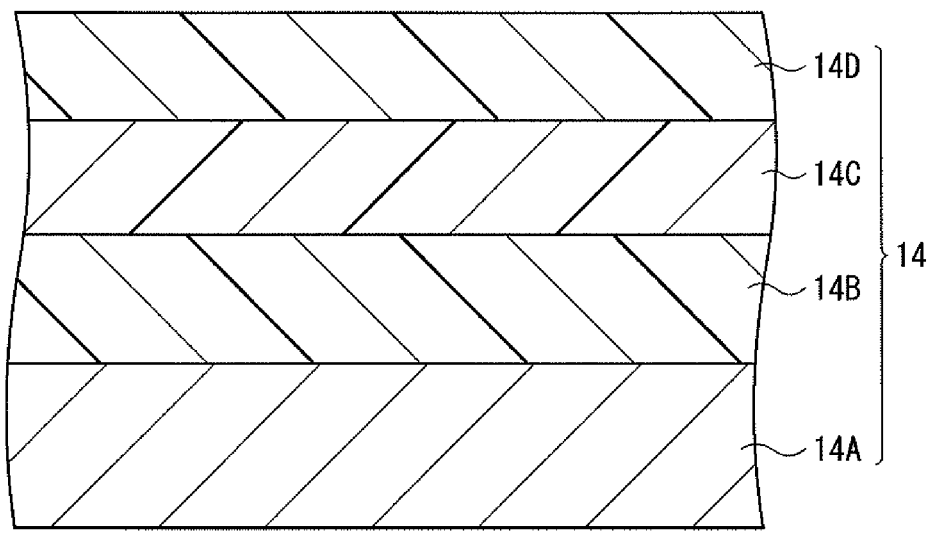

[Fig. 7]
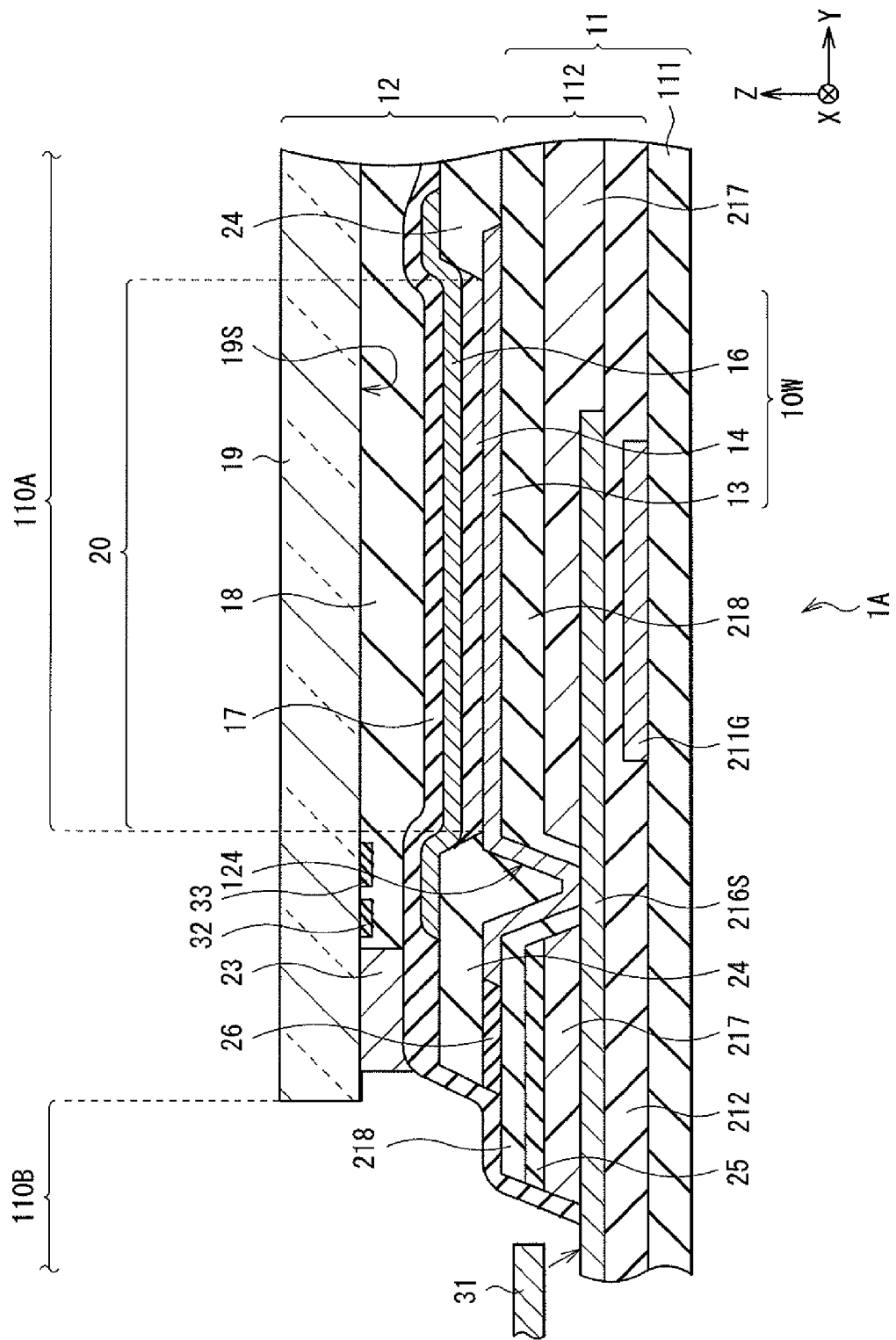

[Fig. 8]
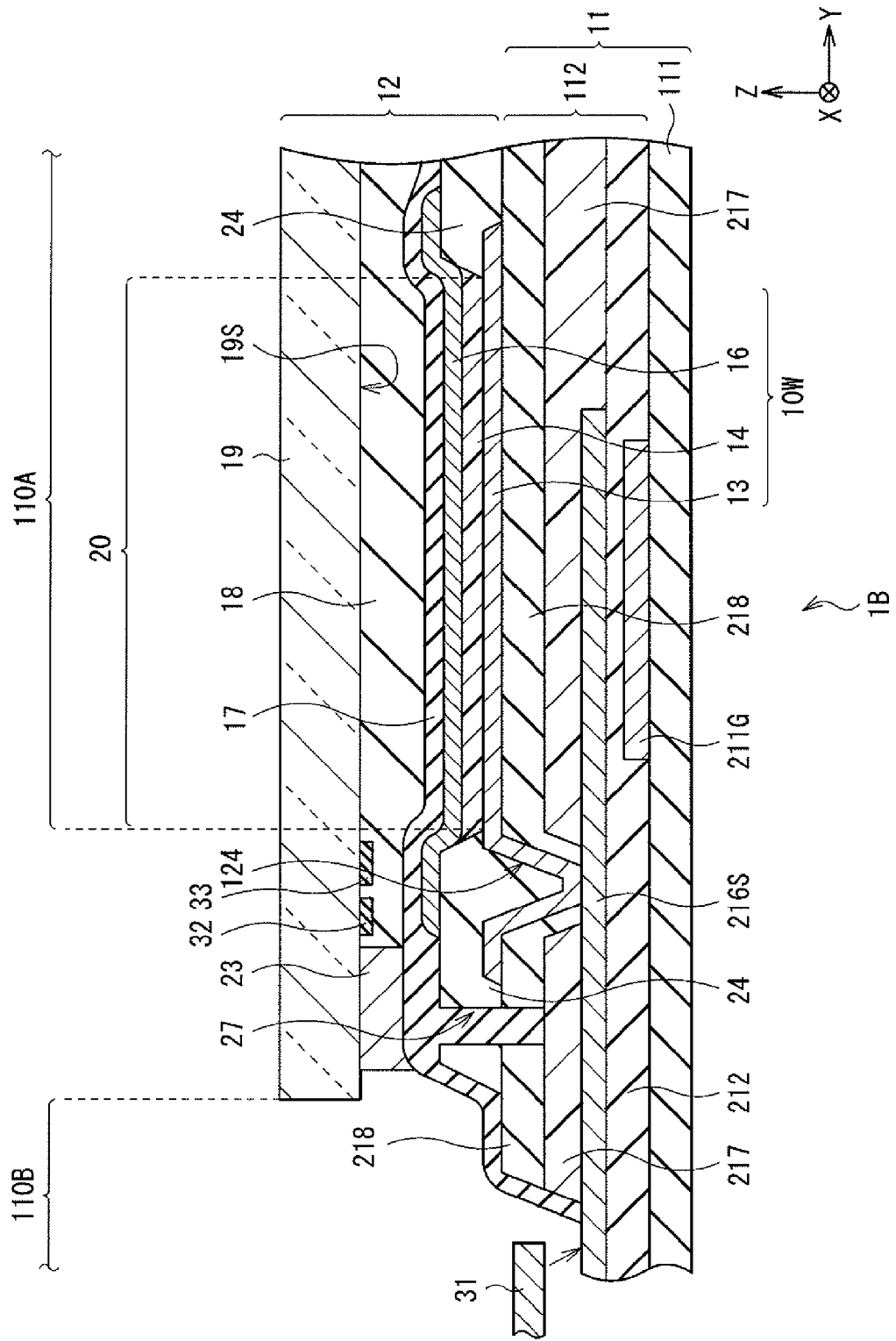

[Fig. 9A]
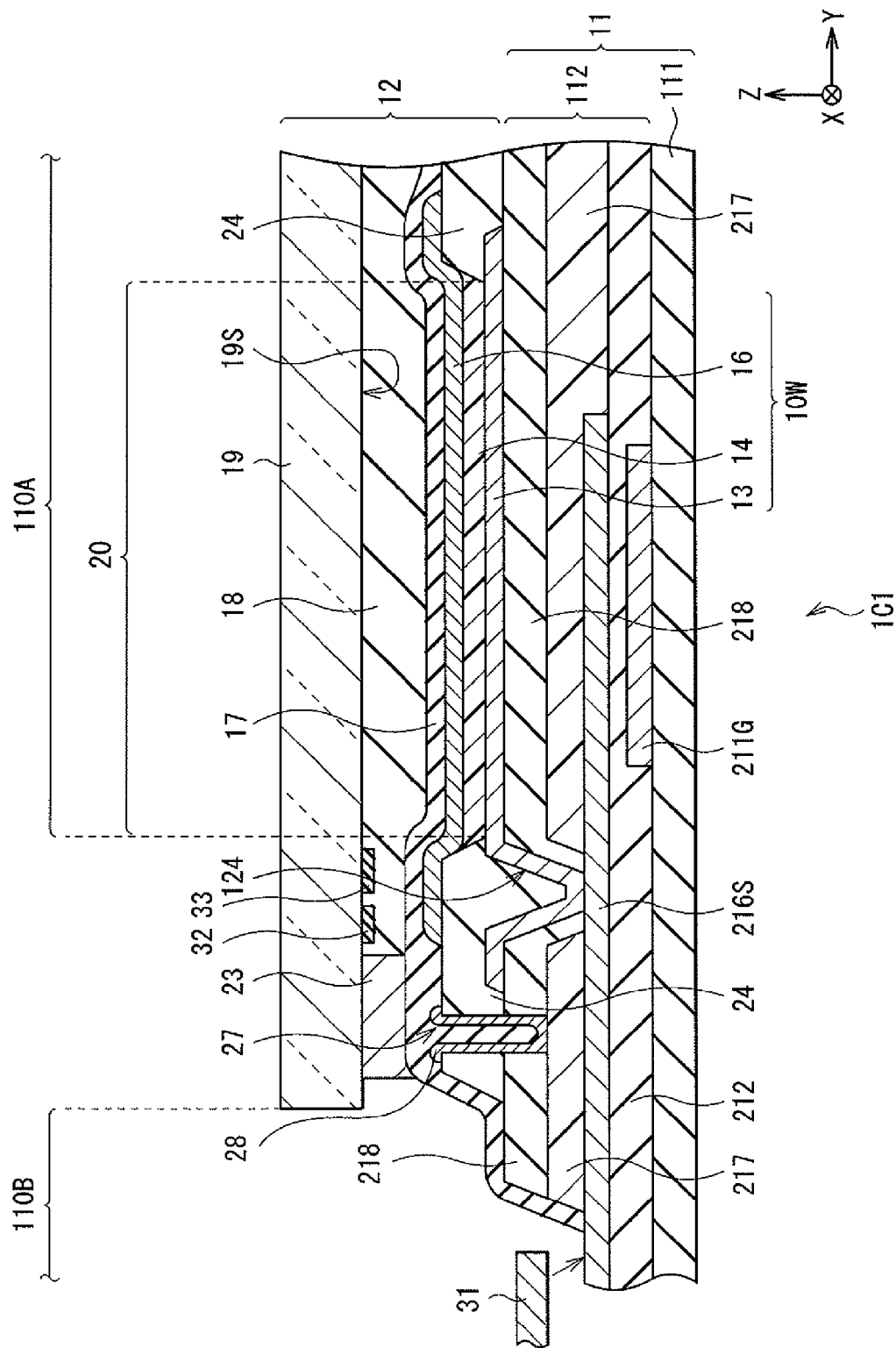

[Fig. 9B]
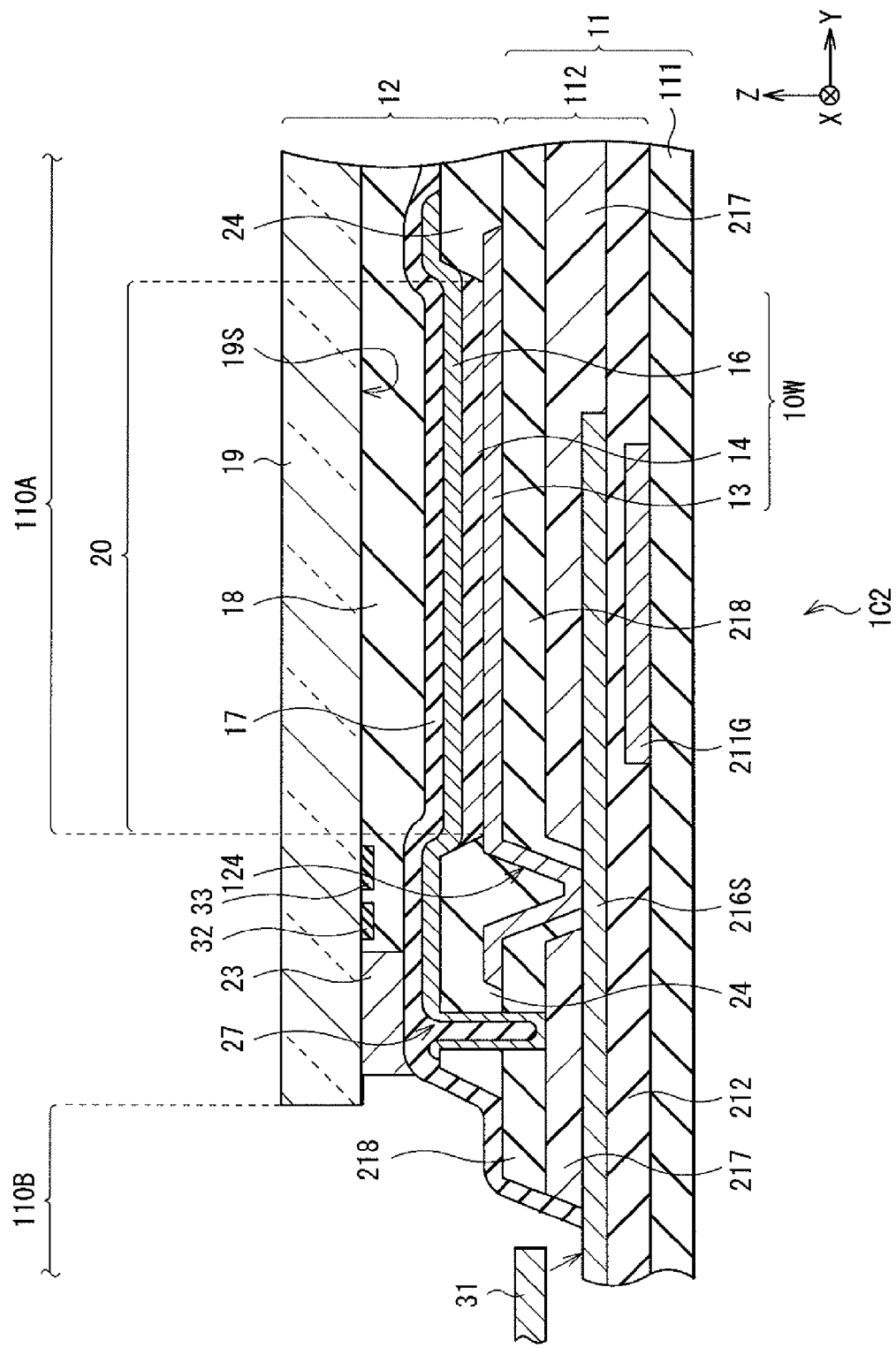

[Fig. 9C]
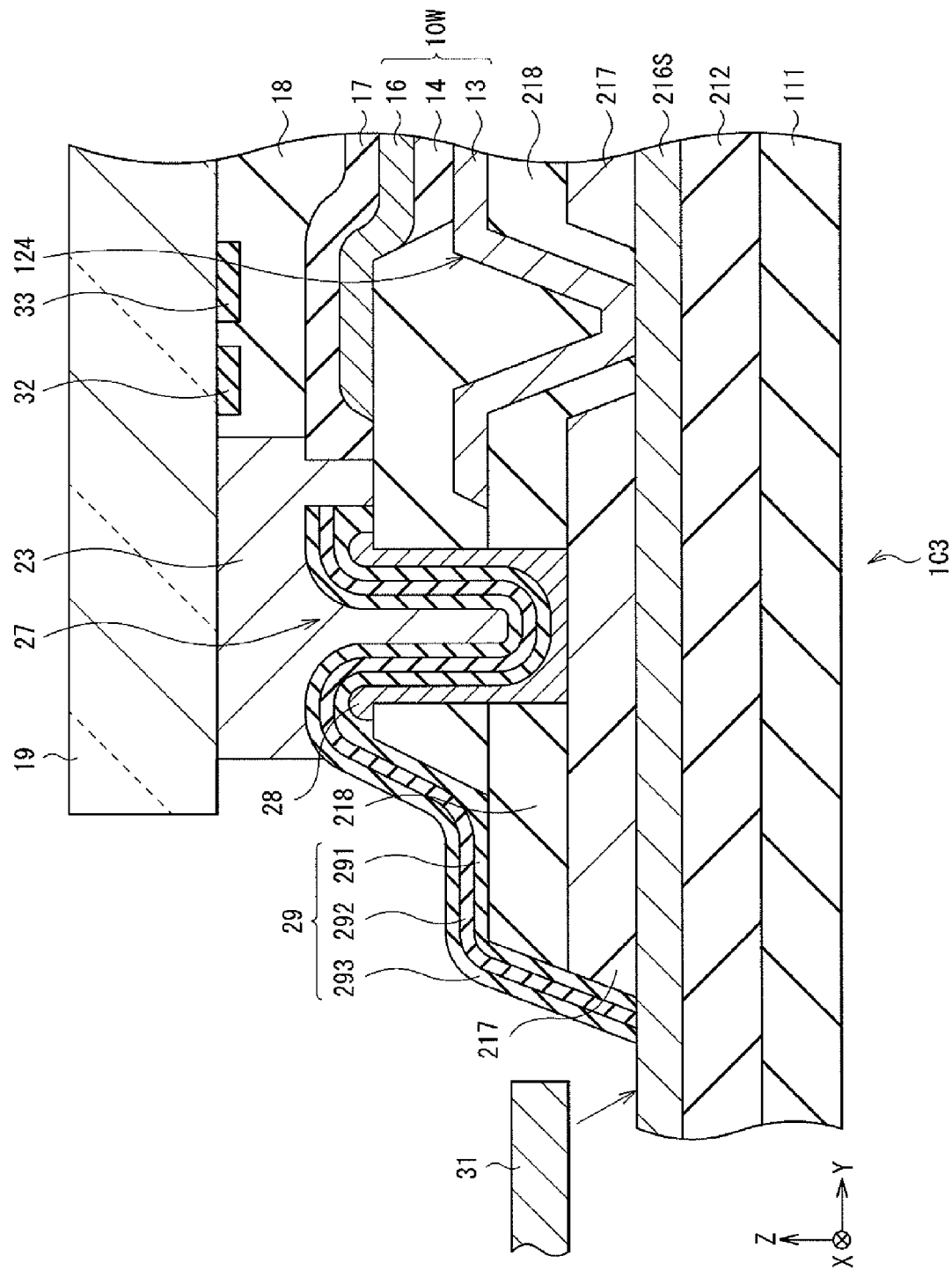

[Fig. 10]
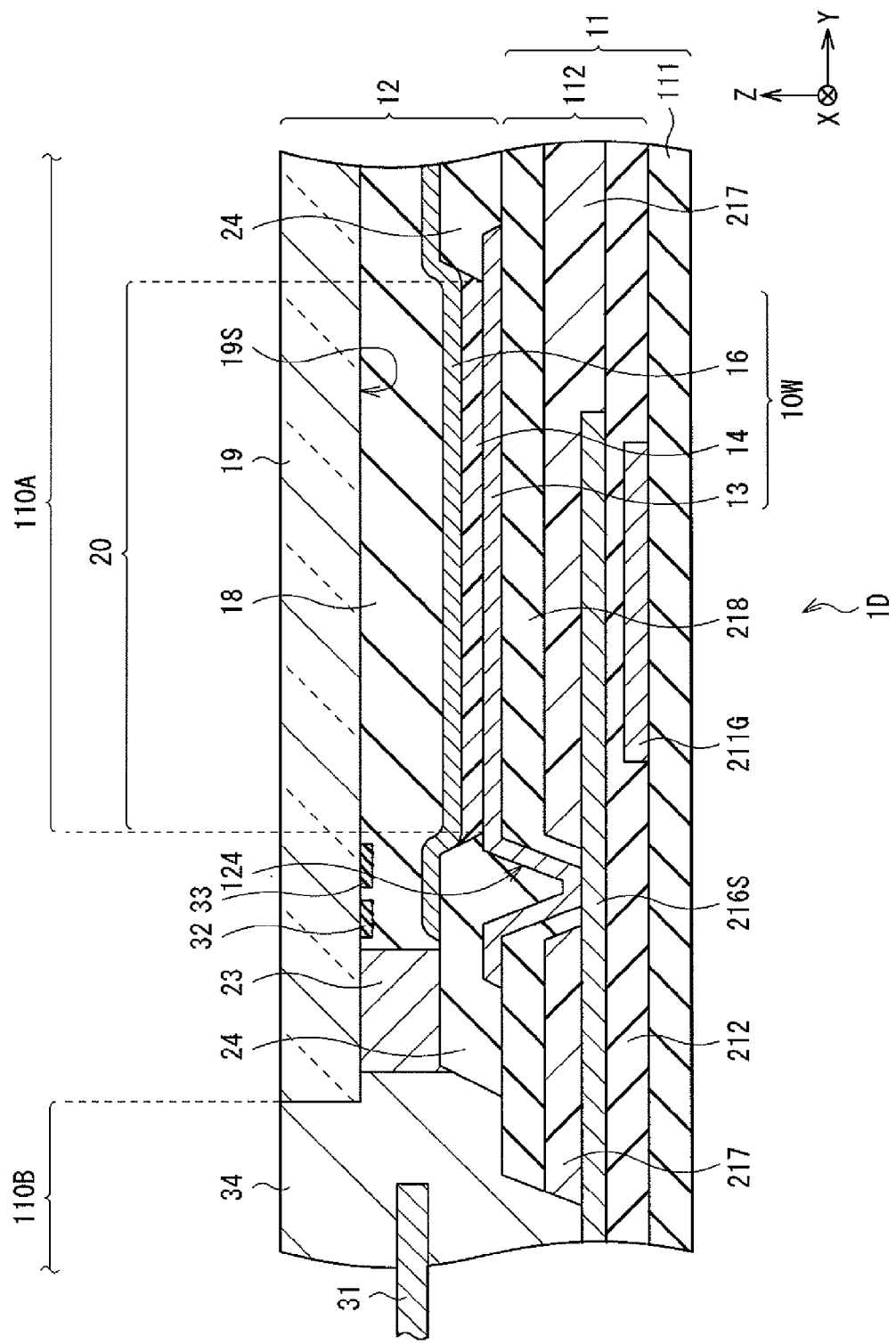

[Fig. 11]
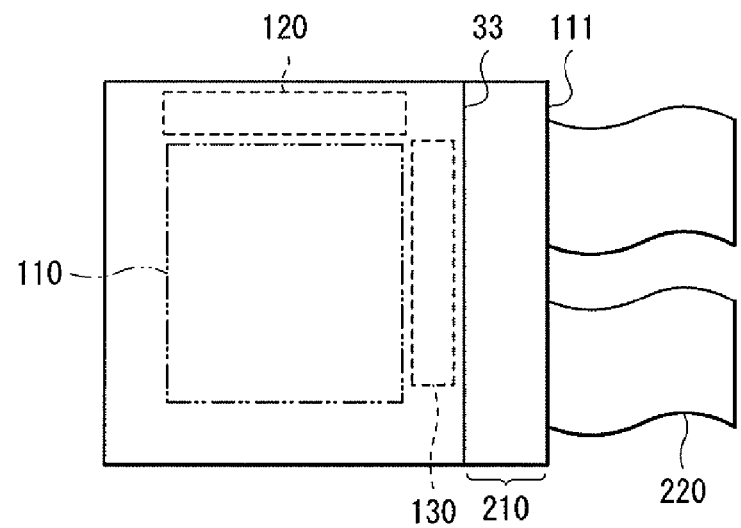
[Fig. 12]
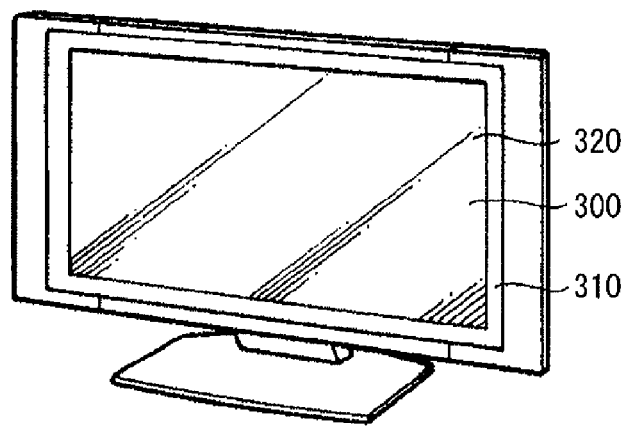
[Fig. 13A]
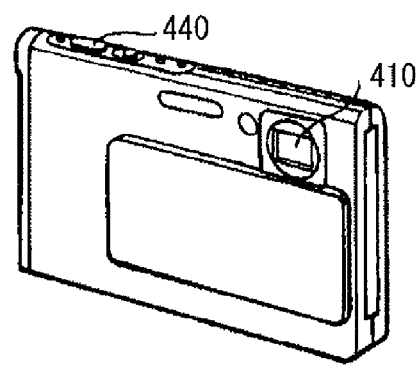

[Fig. 13B]
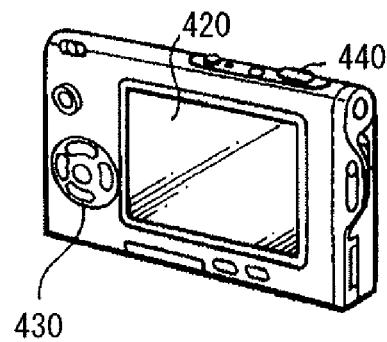
[Fig. 14]
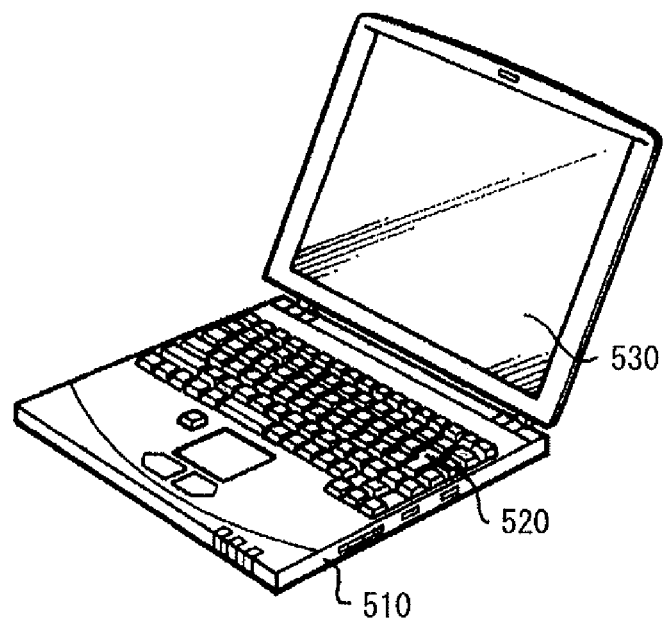

[Fig. 15]
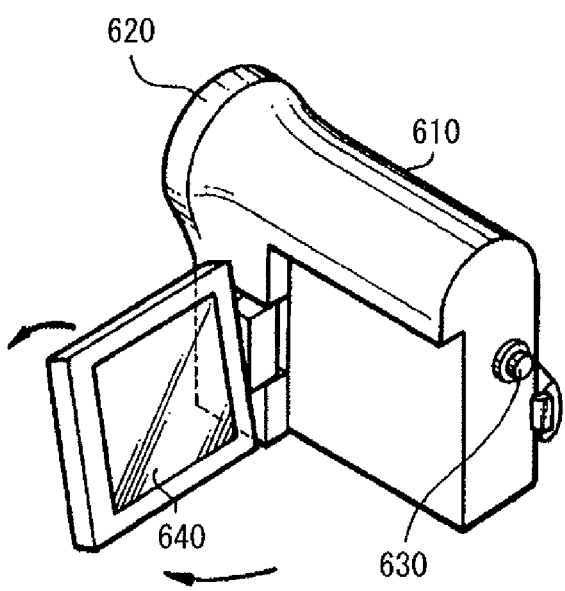

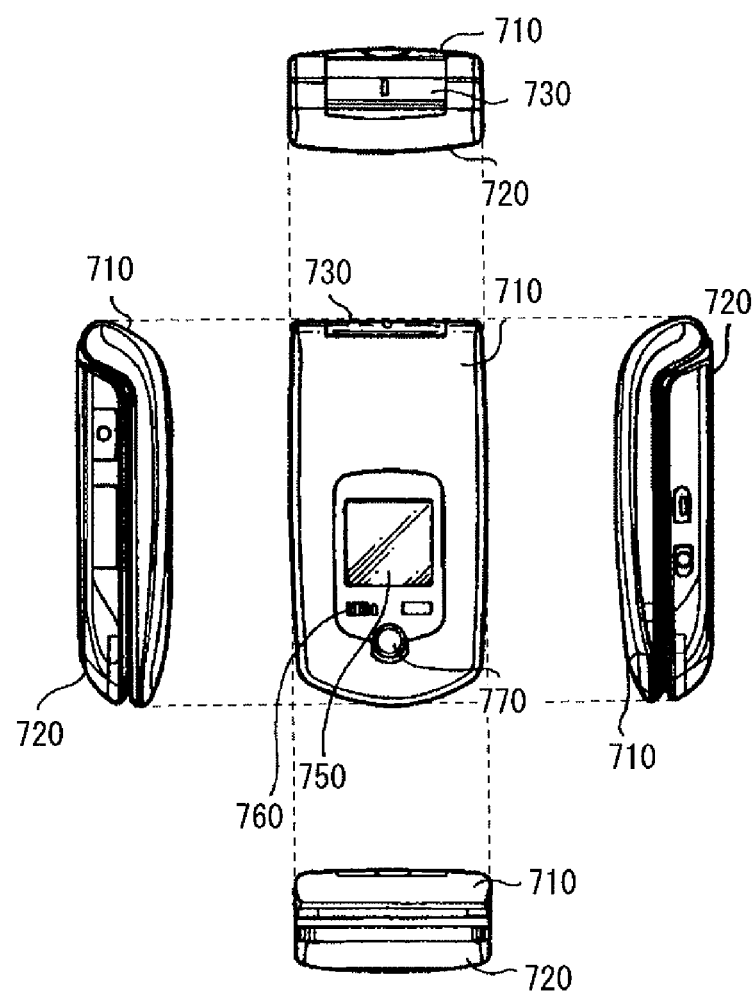
[Fig. 16A]

[Fig. 16B]
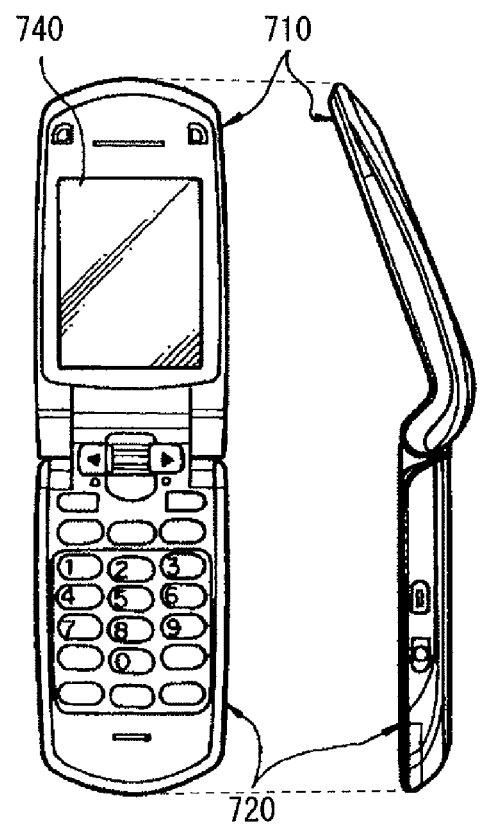

[Fig. 17A]
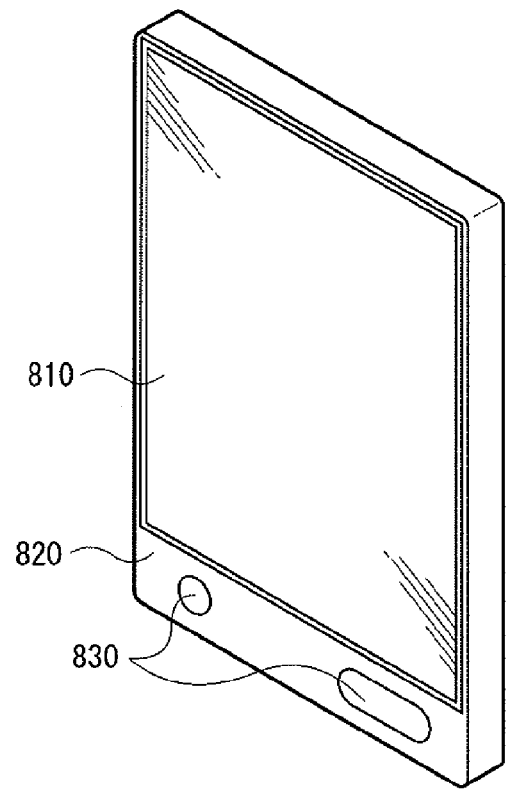
[Fig. 17B]
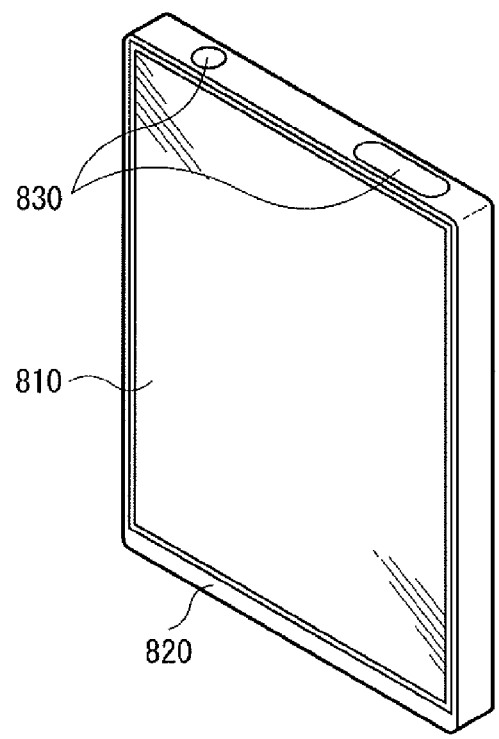

[Fig. 18]
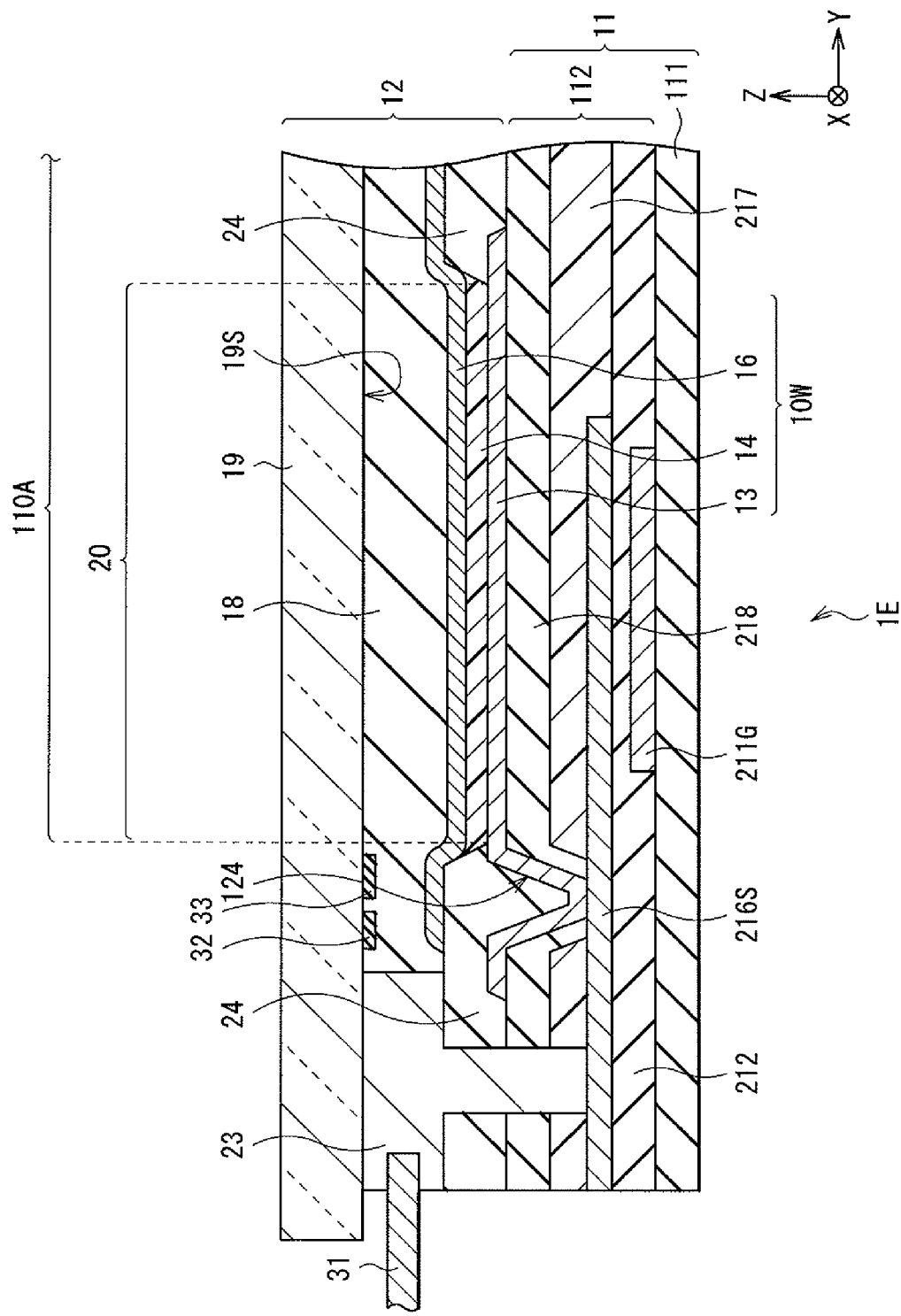

[Fig. 19A]
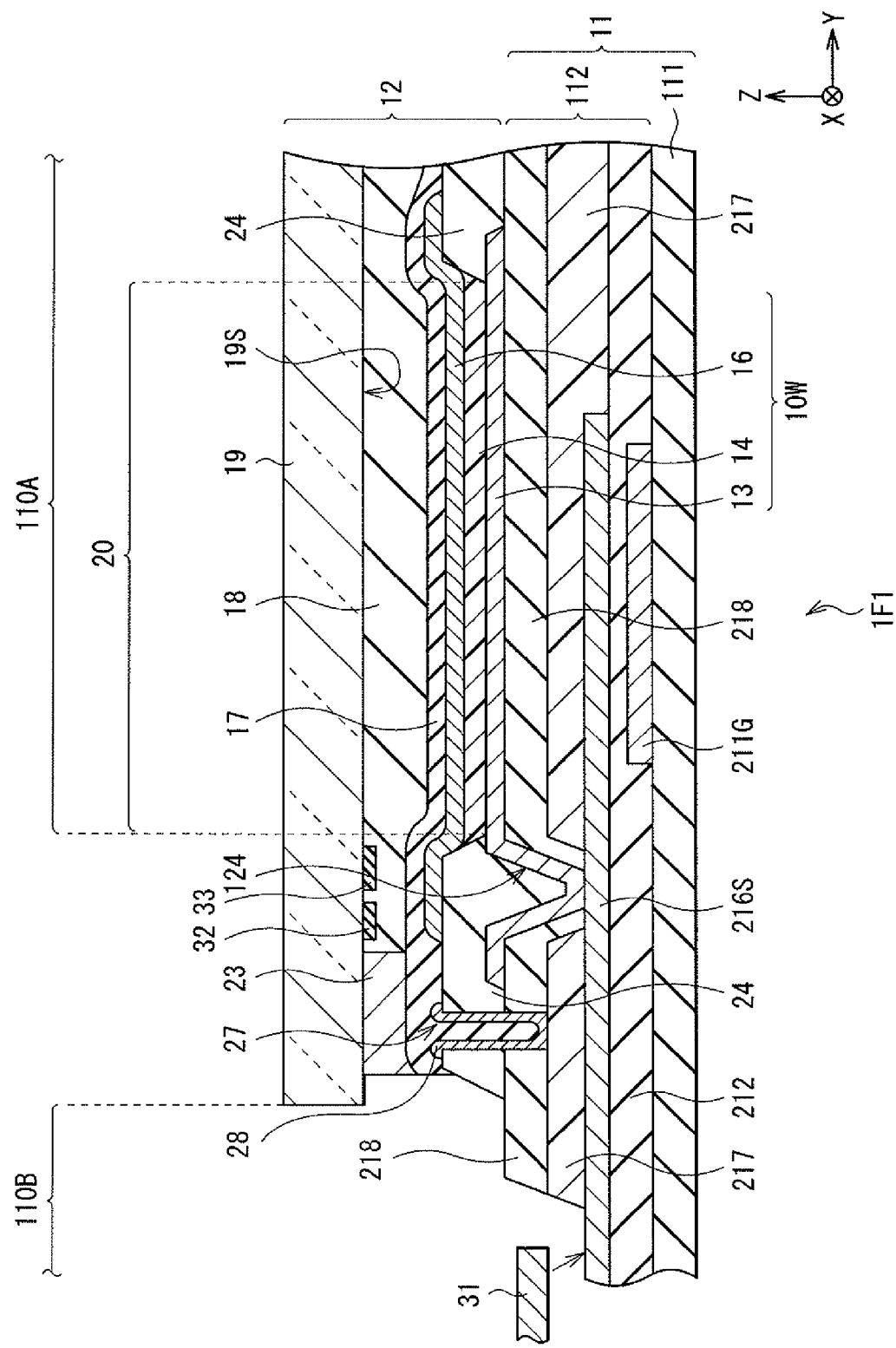

[Fig. 19B]
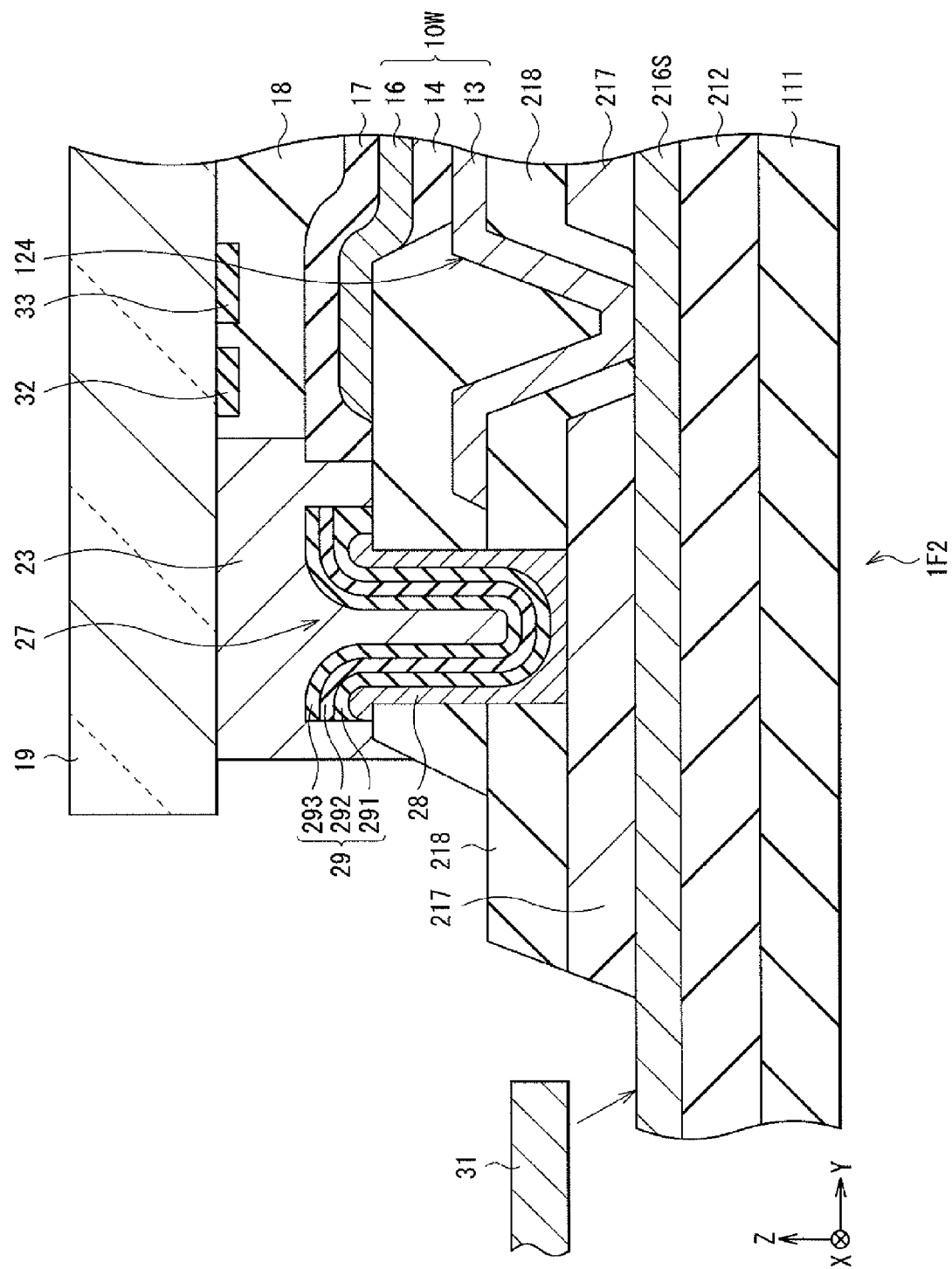

[Fig. 20]
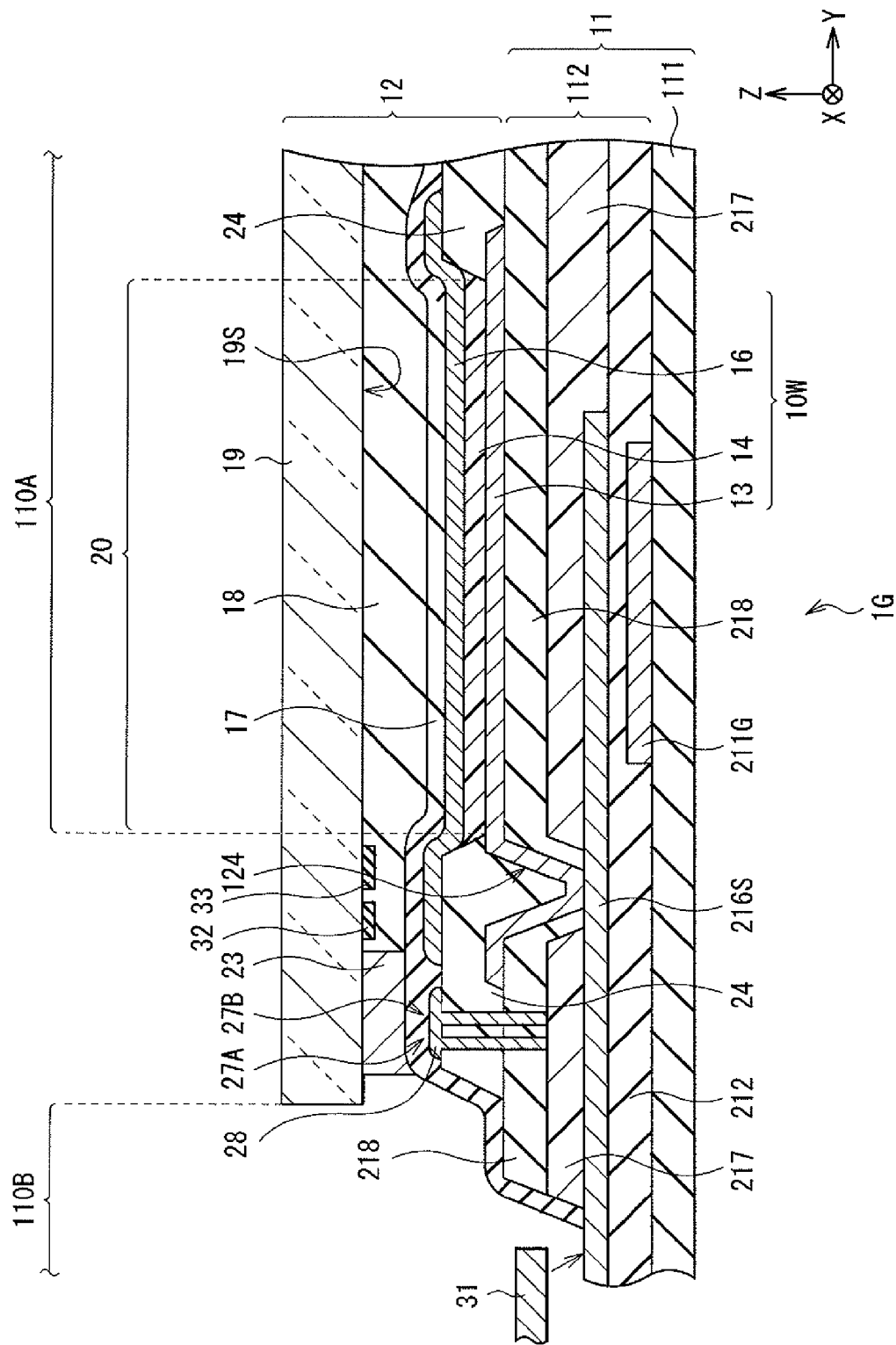

[Fig. 21A]
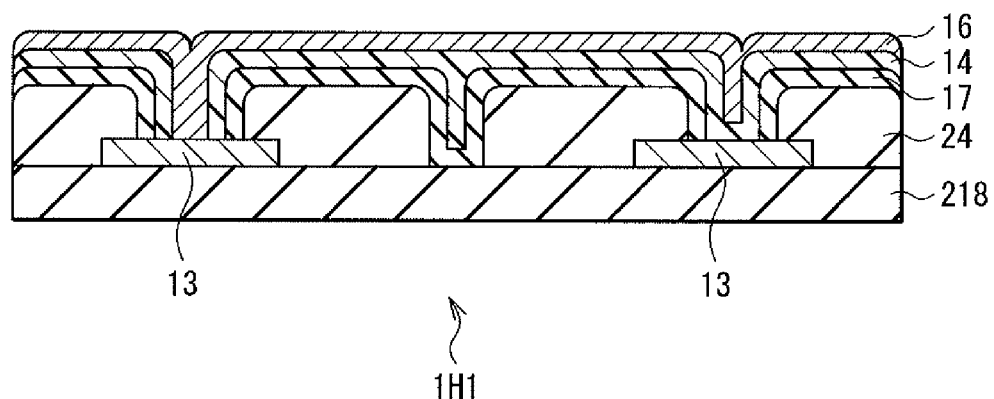
[Fig. 21B]
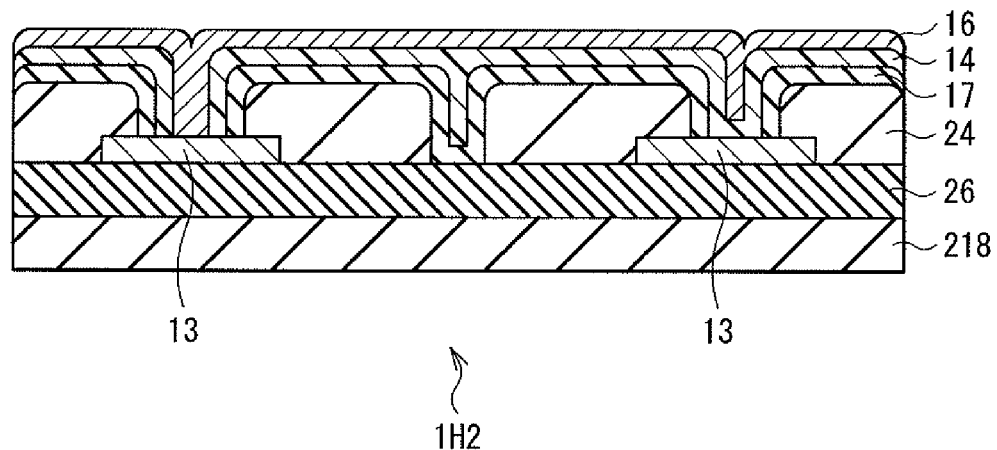

[Fig. 22A]
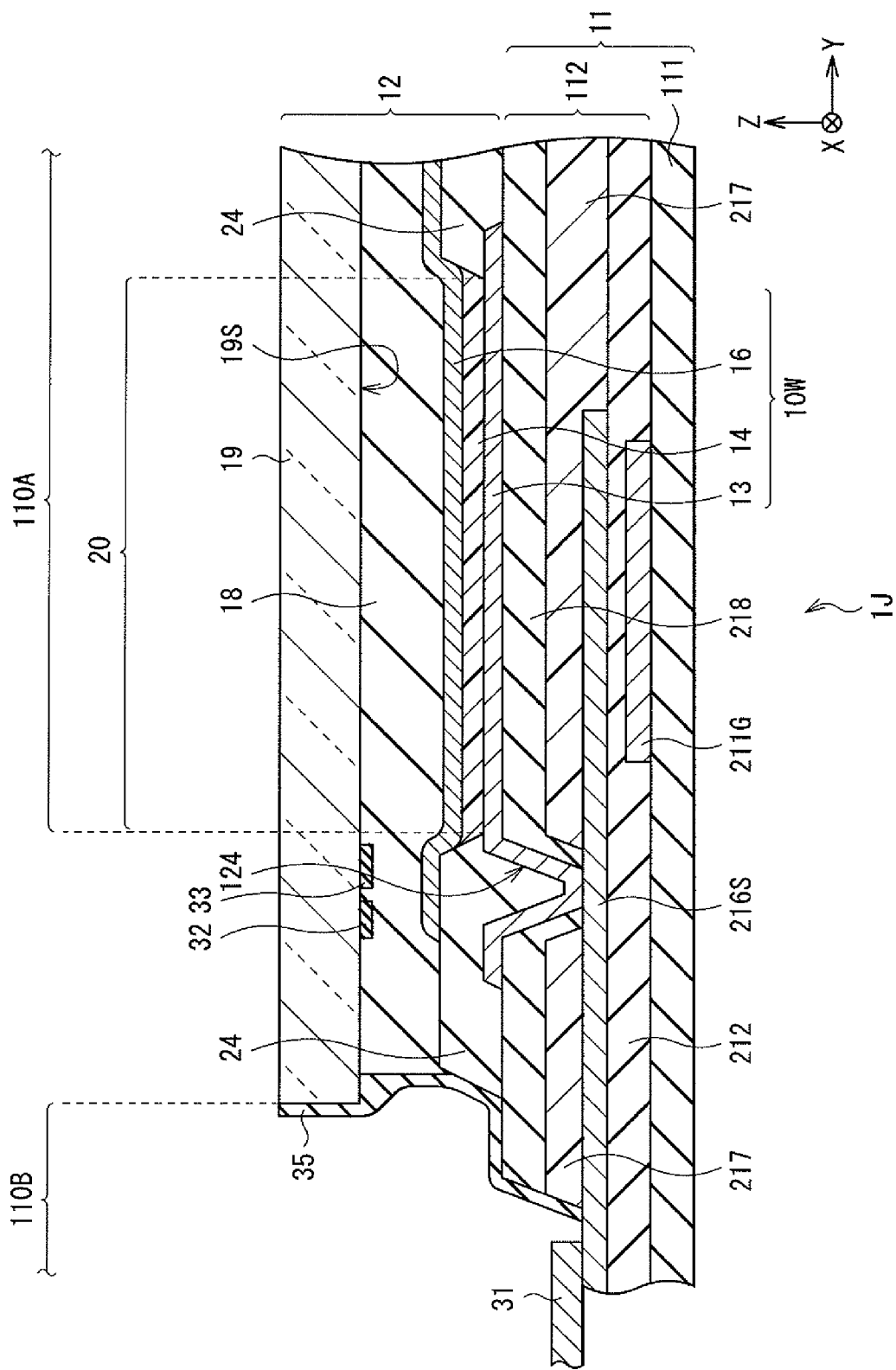

[Fig. 22B]
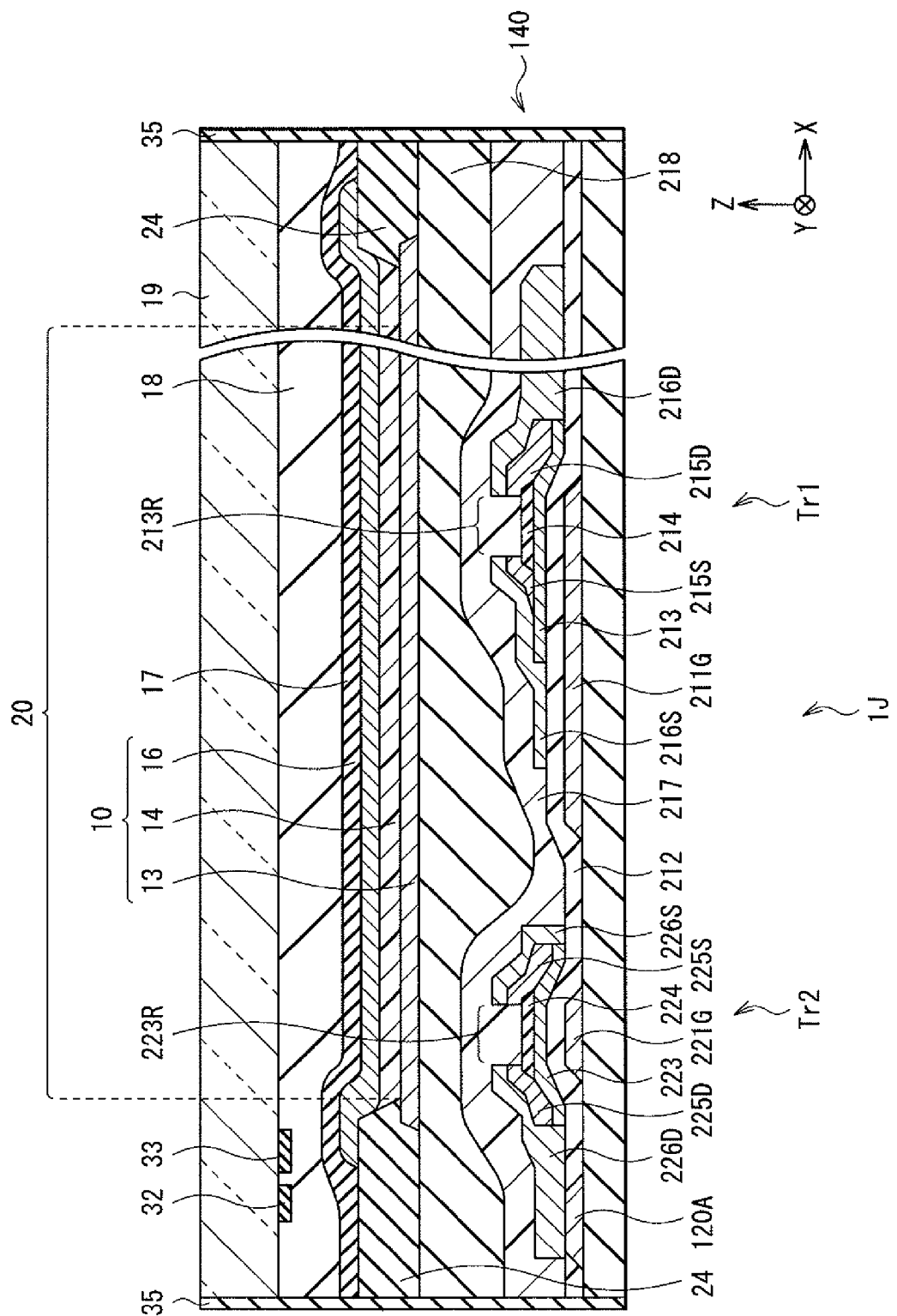

[Fig. 23]
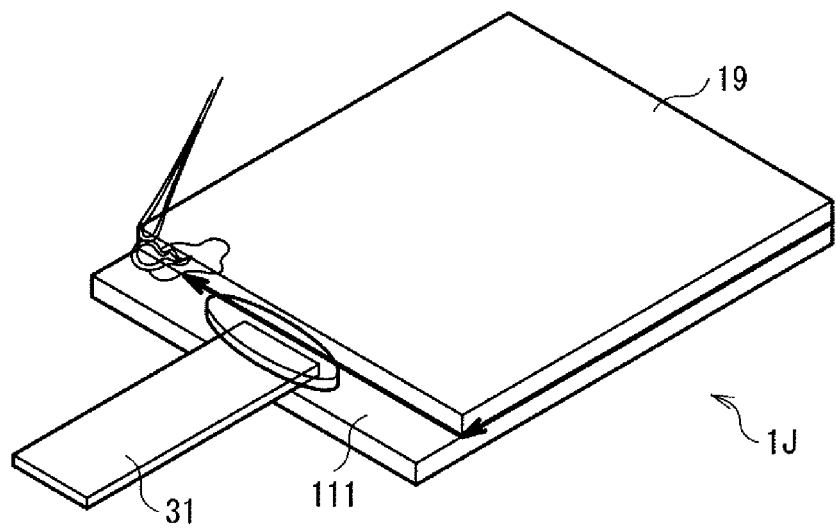

[Fig. 24A]
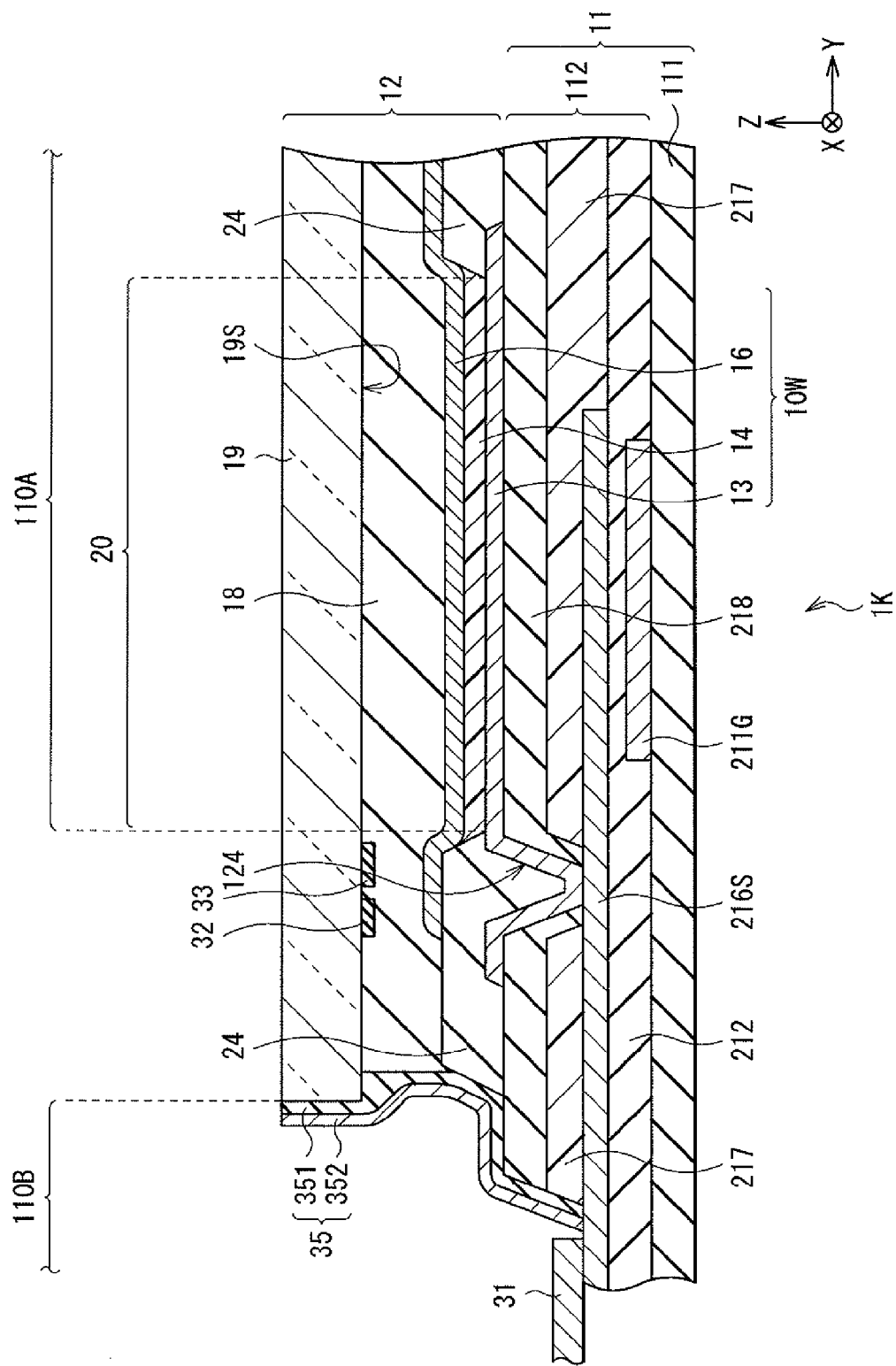

[Fig. 24B]
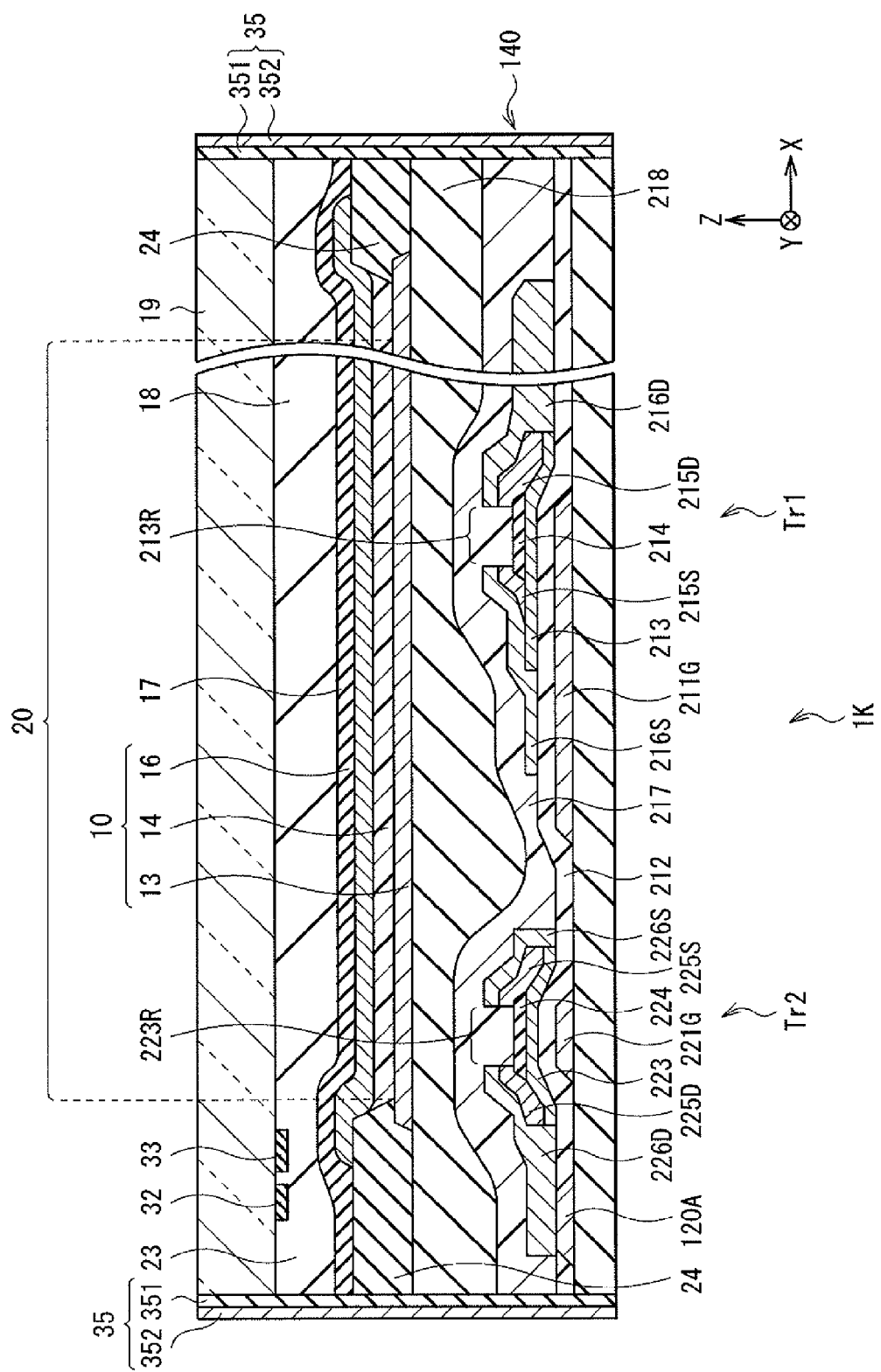

[Fig. 25]
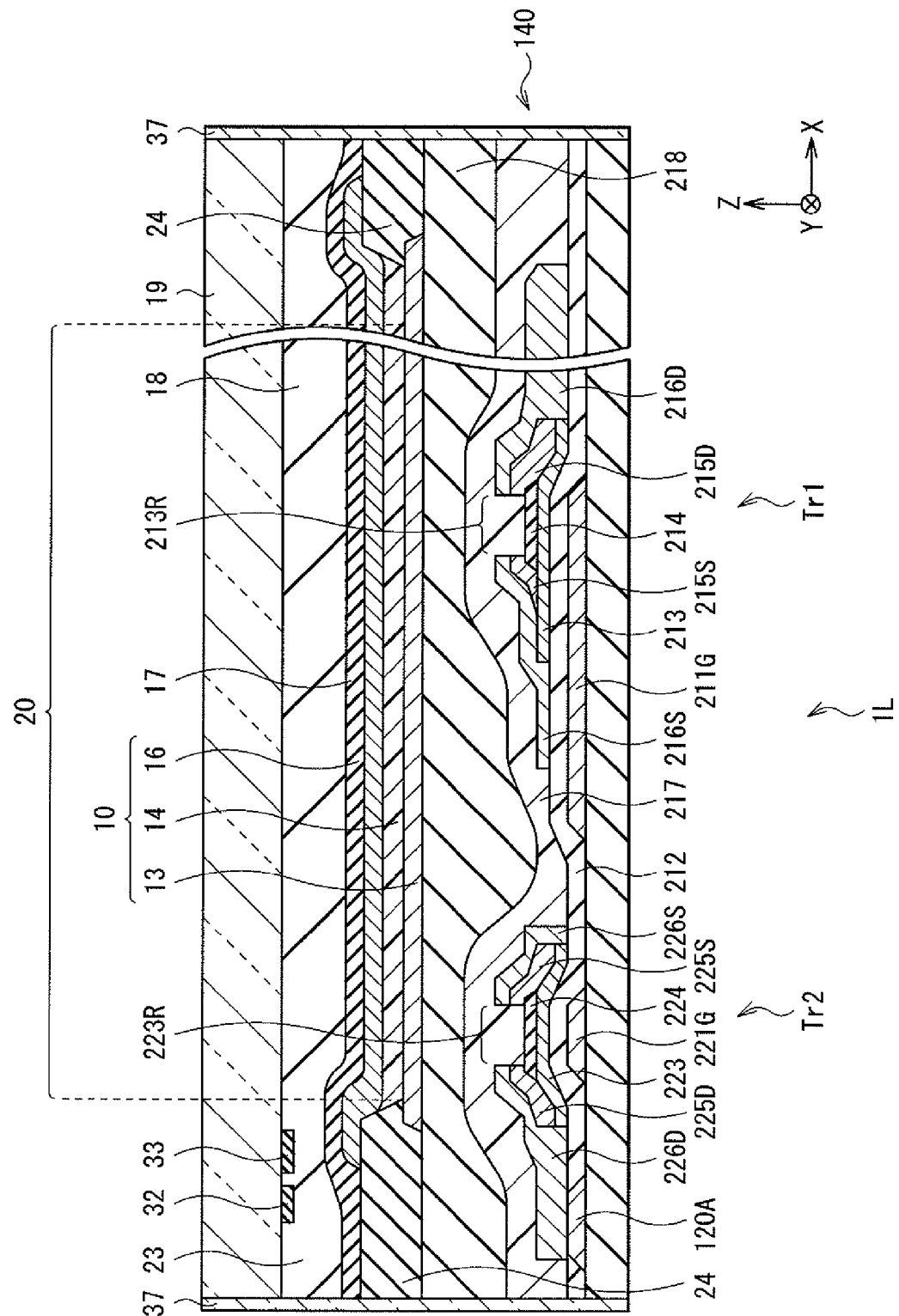

[Fig. 26]
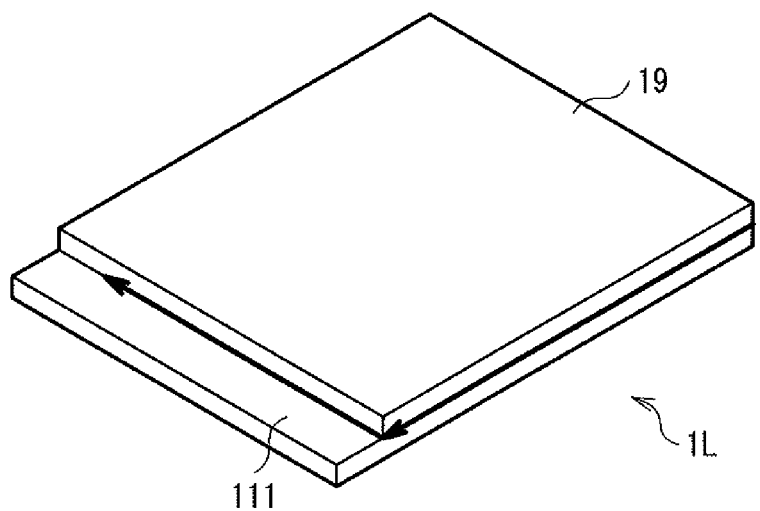

[Fig. 27]
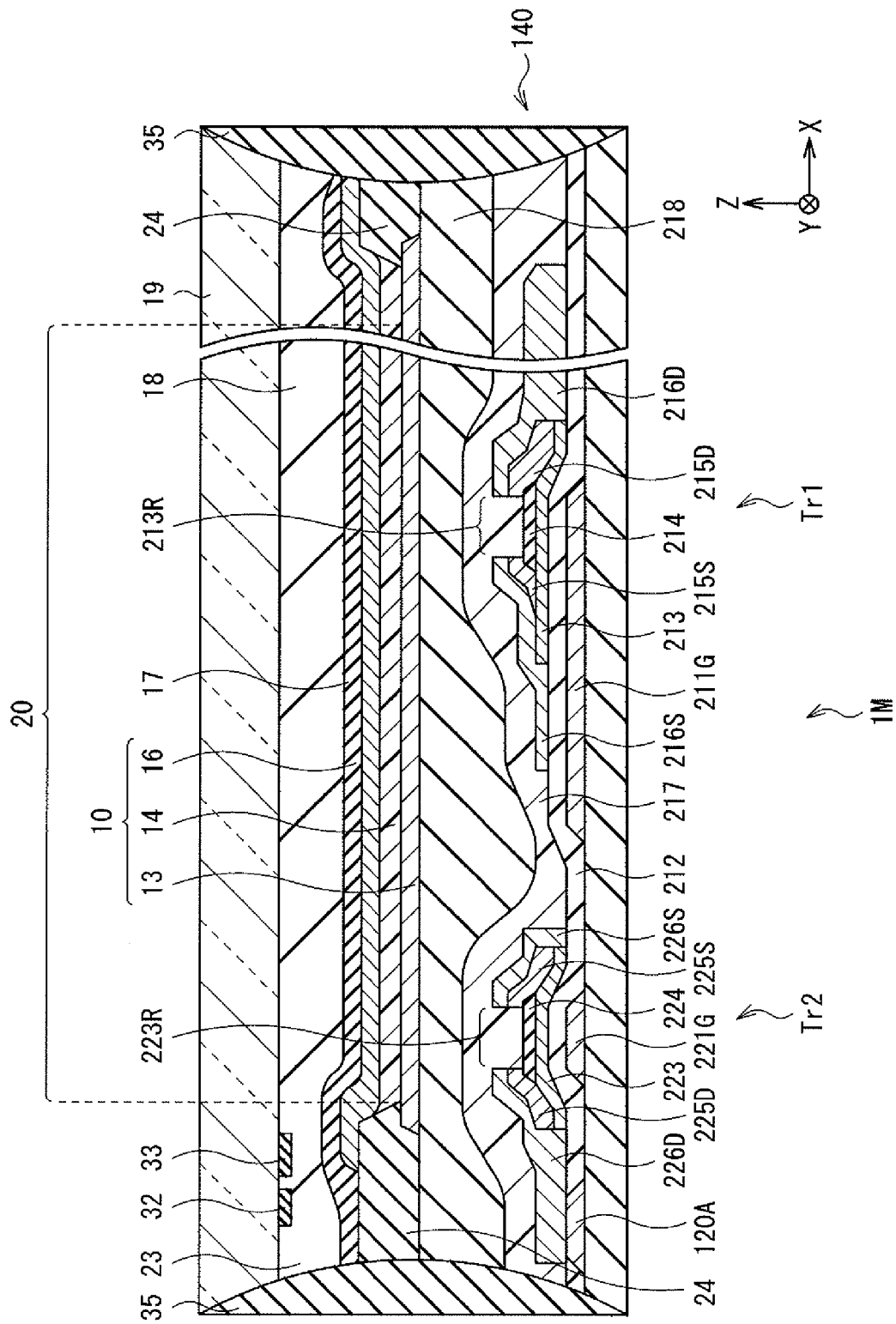

DISPLAY UNIT WITH MOISTURE PROOF FILM OUTSIDE OF SEAL SECTION AND ELECTRONIC APPARATUS WITH SAID DISPLAY UNIT

TECHNICAL FIELD

The technology relates to a display unit having a self-luminous-type light-emitting element including an organic layer, and also to an electronic apparatus provided with such a display unit.

BACKGROUND ART

An organic electroluminescence (EL) element, which emits light by using an organic EL phenomenon of an organic material, includes an organic layer in which an organic hole transport layer and an organic luminous layer are laminated between an anode and a cathode. The organic EL element has been receiving attention as a light-emitting element capable of achieving high-intensity light emission through low-voltage DC driving. However, in a display unit (an organic EL display unit) using this organic EL element, deterioration of the organic layer in the organic EL element occurs due to moisture absorption, leading to a decrease in light emission intensity or instability of light emission in the organic EL element, for example. Therefore, this type of display unit has disadvantages such as low stability over time and a short life.

Thus, Japanese Unexamined Patent Application Publication No. 2002-93576, for example, has proposed an organic EL display unit in which a cover material for the purpose of sealing is provided on an element-formation-surface side of a substrate, on which side an organic EL element and other circuits are formed, and an edge section between the substrate and the cover material is sealed by a sealant. JP2002-93576A has also proposed a configuration in which the outside of the sealant is covered with a hard carbon film serving as a protective film that prevents entrance of water vapor and the like. This configuration makes it possible to completely shield the organic EL element formed on the substrate from the outside, and prevent entrance of substances such as water and oxygen which accelerate deterioration caused by oxidation of the organic EL element.

Further, there has been also proposed an organic EL display unit of a complete solid type in which a cover material for the purpose of sealing is adhered to an element-formation-surface side of a substrate with an adhesive interposed therebetween, on which side an organic EL element and other circuits are formed.

Furthermore, there has been also proposed an organic EL display unit in which a separation groove, which separates an organic insulating film into an inner region side and an outer region side thereof, is formed at a position surrounding a display region (i.e. on an outer edge side of the display region). See, for example, Japanese Unexamined Patent Application Publications No. 2006-54111 and No. 2008-283222. Providing this separation groove prevents water, which is present on the outer region side in the organic insulating film, from entering the inner region side (i.e. a display region side) by passing through the inside of this organic insulating film. Therefore, it is possible to suppress deterioration of an organic layer (an organic EL element) resulting from the passage of the water, which is left in the display unit, through the organic insulating film.

CITATION LIST

Patent Literature

[PTL 1]
Japanese Unexamined Patent Application Publication No. 2002-93576
[PTL 2]
Japanese Unexamined Patent Application Publication No. 2006-54111
[PTL 3]
Japanese Unexamined Patent Application Publication No. 2008-283222

SUMMARY

Technical Problem

Meanwhile, in recent years, organic EL display units have been mounted on portable information terminals such as so-called tablet personal computers (PCs) and smartphones (multifunctional portable telephones). For this type of portable information terminal, it is difficult to increase the size of a main body in view of portability. However, it is necessary that an effective screen region be as large as possible, from the viewpoint of securing visibility and operability for users. Therefore, it is desired to provide a so-called slim bezel, i.e. to reduce an area occupied by a peripheral region except the effective screen region in the main body of the portable information terminal, as much as possible.

In a structure like those proposed by Japanese Unexamined Patent Application Publications No. 2006-54111 and No. 2008-283222 mentioned above, however, it is difficult to provide a slim bezel in a case where an area mask is used to form a film of the organic layer or the like, such as a case of using a white organic EL element. In other words, in reality, it is necessary to form the above-described separation groove at a position sufficiently away from the display region, considering misalignment of the area mask (a mask misalignment region) and a wraparound (a tapered region) of the film. Thus, it is necessary to secure a wide bezel (i.e. necessary to increase the distance between the display region and the peripheral region), making it difficult to provide a slim bezel. In addition, since it is necessary to increase the distance between the display region and the peripheral region, water contained in the organic insulating layer in this region (an internal region of the separation groove) enters the organic layer, thereby deteriorating the organic layer.

It is desirable to provide a display unit having high reliability and a larger effective screen region while suppressing deterioration of a light-emitting element caused by water, and an electronic apparatus provided with such a display unit.

Solution to Problem

A display unit according to an embodiment of the technology includes: a first substrate and a second substrate that are disposed to face each other; a first organic insulating layer provided on the first substrate; a plurality of light-emitting elements arrayed in a display region, in which the display region is provided on the first organic insulating layer and faces the second substrate; and a first moisture-proof film covering the first organic insulating layer in a peripheral region, in which the peripheral region is provided on the first substrate and surrounds the display region.

An electronic apparatus according to an embodiment of the technology is provided with a display unit. The display unit includes: a first substrate and a second substrate that are disposed to face each other; a first organic insulating layer provided on the first substrate; a plurality of light-emitting elements arrayed in a display region, in which the display region is provided on the first organic insulating layer and faces the second substrate; and a first moisture-proof film covering the first organic insulating layer in a peripheral region, in which the peripheral region is provided on the first substrate and surrounds the display region.

In the display unit and the electronic apparatus according to the above-described embodiments of the technology, the first organic insulating layer in the peripheral region is covered with the first moisture-proof film. Therefore, the first organic insulating layer is sufficiently shielded from outside air containing water.

Advantageous Effects of Invention

According to the display unit and the electronic apparatus in the above-described embodiments of the technology, since the first moisture-proof film is provided, it is possible to effectively prevent entrance of water from the peripheral region into the display region while providing a simple configuration. Therefore, deterioration of the light-emitting elements is prevented, which allows high reliability to be realized while also achieving a slim bezel.

It is to be understood that both the foregoing general description and the following detailed description are exemplary, and are intended to provide further explanation of the technology as claimed.

BRIEF DESCRIPTION OF DRAWINGS

FIG. 1 is a diagram illustrating a configuration of a display unit according to an embodiment of the technology.

FIG. 2 is a diagram illustrating an example of a pixel driving circuit depicted in FIG. 1.

FIG. 3 is a plan view illustrating a configuration of a display region depicted in FIG. 1.

FIG. 4 is a cross-sectional diagram illustrating a configuration of the display region depicted in FIG. 1.

FIG. 5 is another cross-sectional diagram illustrating the configuration of the display region depicted in FIG. 1.

FIG. 6 is an enlarged cross-sectional diagram illustrating an organic layer depicted in FIG. 4 and FIG. 5.

FIG. 7 is a cross-sectional diagram illustrating a main-part configuration of a display unit according to a first modification.

FIG. 8 is a cross-sectional diagram illustrating a main-part configuration of a display unit according to a second modification.

FIG. 9A is a cross-sectional diagram illustrating a main-part configuration of a display unit according to a third modification.

FIG. 9B is a cross-sectional diagram illustrating a main-part configuration of a display unit according to a fourth modification.

FIG. 9C is an enlarged cross-sectional diagram illustrating a main-part configuration of a display unit according to a fifth modification.

FIG. 10 is a cross-sectional diagram illustrating a main-part configuration of a display unit according to a sixth modification.

FIG. 11 is a plan view illustrating a schematic configuration of a module including the display unit according to any of the above-described embodiment and the modifications.

FIG. 12 is a perspective diagram illustrating an appearance of a television receiver according to a first application example of the display unit.

FIG. 13A is a first perspective diagram illustrating an appearance of a digital camera according to a second application example of the display unit.

FIG. 13B is a second perspective diagram illustrating an appearance of the digital camera according to the second application example of the display unit.

FIG. 14 is a perspective diagram illustrating an appearance of a laptop computer according to a third application example of the display unit.

FIG. 15 is a perspective diagram illustrating an appearance of a video camera according to a fourth application example of the display unit.

FIG. 16A is a diagram illustrating appearances of a portable telephone according to a fifth application example of the display unit, namely, a front view, a left-side view, a right-side view, a top view, and a bottom view of the portable telephone in a closed state.

FIG. 16B is a diagram illustrating appearances of the portable telephone according to the fifth application example of the display unit, namely, a front view and a side view of the portable telephone in an open state.

FIG. 17A is a first perspective diagram illustrating an appearance of a tablet type PC according to a sixth application example using the display unit.

FIG. 17B is a second perspective diagram illustrating an appearance of the tablet type PC according to the sixth application example using the display unit.

FIG. 18 is a cross-sectional diagram illustrating a main-part configuration of a display unit according to a seventh modification.

FIG. 19A is a cross-sectional diagram illustrating a main-part configuration of a display unit according to an eighth modification.

FIG. 19B is an enlarged cross-sectional diagram illustrating a main-part configuration of a display unit according to a ninth modification.

FIG. 20 is a cross-sectional diagram illustrating a main-part configuration of a display unit according to a tenth modification.

FIG. 21A is a cross-sectional diagram illustrating a main-part configuration of a display unit according to an eleventh modification.

FIG. 21B is a cross-sectional diagram illustrating a main-part configuration of a display unit according to a twelfth modification.

FIG. 22A is a cross-sectional diagram illustrating a main-part configuration of a display unit according to a thirteenth modification.

FIG. 22B is another cross-sectional diagram illustrating the main-part configuration of the display unit according to the thirteenth modification.

FIG. 23 is a perspective diagram used to describe a method of manufacturing the display unit depicted in FIGS. 22A and 22B.

FIG. 24A is a cross-sectional diagram illustrating a main-part configuration of a display unit according to a fourteenth modification.

FIG. 24B is another cross-sectional diagram illustrating the main-part configuration of the display unit according to the fourteenth modification.

FIG. 25 is a cross-sectional diagram illustrating a main-part configuration of a display unit according to a fifteenth modification.

FIG. 26 is a perspective diagram used to describe a method of manufacturing the display unit depicted in FIG. 25.

FIG. 27 is a cross-sectional diagram illustrating a main-part configuration of a display unit according to a sixteenth modification.

DESCRIPTION OF EMBODIMENTS

An embodiment and application examples of the disclosure will be described in detail with reference to the drawings. It is to be noted that the description will be provided in the following order.
1. Embodiment (FIG. 1 to FIG. 10): a display unit
2. Application examples of display unit (FIG. 11 to FIG. 17B): electronic apparatuses Embodiment (Overall Configuration Example of Organic EL Display Unit)

FIG. 1 illustrates an overall configuration example of an organic EL display unit 1 (hereinafter simply referred to as the display unit 1) according to an embodiment of the technology. The display unit 1 may be used as an organic EL television receiver and has a display region 110A on a substrate 111. In this display region 110A, a plurality of subpixels 10R, 10G, and 10B are arranged in a matrix. The subpixels 10R display red color, the subpixels 10G display green color, and the subpixels 10B display blue color. Here, subpixels displaying the same color are arranged in a line in a Y direction, and this line is repeated sequentially in an X direction. Therefore, each combination of three subpixels aligned in the X direction forms a picture element (a pixel). Further, in a peripheral region 110B around (i.e. on an outer edge side or an outer boundary side of) the display region 110A, a signal-line driving circuit 120 and a scanning-line driving circuit 130 serving as drivers for image display (a peripheral circuit 12B which will be described later) are provided.

The signal-line driving circuit 120 supplies a pixel selected through a signal line 120A with a signal voltage of an image signal according to luminance information supplied from a signal supply source (not illustrated).

The scanning-line driving circuit 130 includes a shift register and the like which sequentially perform shifting (transfer) of a start pulse in synchronization with an inputted clock pulse. When an image signal is written to each of the pixels, the scanning-line driving circuit 130 scans the pixels row by row and supplies a scanning signal to each scanning line 130A sequentially.

Within the display region 110A, a pixel driving circuit 140 is provided. FIG. 2 illustrates an example of this pixel driving circuit 140 (i.e. an example of a pixel circuit of the subpixels 10R, 10G, and 10B). The pixel driving circuit 140 is an active drive circuit formed below a first electrode layer 13 described later (a pixel-driving-circuit formation layer 112 described later). This pixel driving circuit 140 includes a drive transistor Tr1, a write transistor Tr2, and a capacitor (a retention capacitor) Cs provided therebetween. The pixel driving circuit 140 further includes a white organic EL element 10W (hereinafter simply referred to as the EL element 10W) connected to the drive transistor Tr1 in series, between a first power source line (Vcc) and a second power source line (GND). In other words, each of the subpixels 10R, 10G, and 10B is provided with this EL element 10W. The drive transistor Tr1 and the write transistor Tr2 are each configured using a typical Thin Film Transistor (TFT), and may be each configured to have, but not limited to, an inverted staggered structure (a so-called bottom-gate type) or a staggered structure (a top-gate type), for example.

In the pixel driving circuit 140, a plurality of signal lines 120A are arranged in a column direction, and a plurality of scanning lines 130A are arranged in a row direction. An intersection between each of the signal lines 120A and each of the scanning lines 130A corresponds to any one of the subpixels 10R, 10G, and 10B. Each of the signal lines 120A is connected to the signal-line driving circuit 120, and an image signal is supplied from this signal-line driving circuit 120 to a source electrode of the write transistor Tr2 through the signal line 120A. Each of the scanning lines 130A is connected to the scanning-line driving circuit 130, and a scanning signal is sequentially supplied from this scanning-line driving circuit 130 to a gate electrode of the write transistor Tr2 through the scanning line 130A.

(Plane Configuration Example of Display Unit)

FIG. 3 illustrates a configuration example of the display region 110A spreading in an XY plane. Here, there is schematically illustrated a plane configuration including the display region 110A and the peripheral region 110B surrounding the display region 110A, when viewed from above. This display region 110A is in a state in which a second electrode layer 16, a filling layer 18, and a sealing substrate 19 (all described later) are removed. In the display region 110A, a plurality of EL elements 10W are arranged in the X direction and the Y direction as illustrated in FIG. 3, i.e. arranged in a matrix as a whole. To be more specific, the EL elements 10W include respective light-emitting sections 20, and one EL element 10W is disposed for each of the subpixels 10R, 10G, and 10B. The light-emitting sections 20 are separated from one another and defined by an aperture-defining insulating film 24.

In FIG. 3, a rectangle indicated by a broken line surrounding the light-emitting section 20 represents a region where an organic layer 14 is formed. Further, a rectangle indicated by a broken line surrounding the region where the organic layer 14 is formed represents a region where the first electrode layer 13 is formed. A part of the first electrode layer 13 is provided with a contact section 124 which may establish conduction with a source electrode of the drive transistor Tr1, for example. It is to be noted that the number of subpixels arranged in each of the X direction and the Y direction is set optionally, without being limited to the number illustrated in FIG. 3. Further, four or more EL elements 10W may be included in one pixel by further providing subpixels which may display yellow and white, for example.

(Cross-Sectional Configuration of Display Unit 1)

FIG. 4 illustrates a schematic configuration of an XZ section of a part in proximity to a border between the display region 110A and the peripheral region 110B, the XZ section being taken along a line IV-IV depicted in FIG. 3. Further, FIG. 5 is a cross-sectional diagram of the display region 110A illustrated in FIG. 3, taken along a line V-V. Furthermore, FIG. 6 illustrates an enlarged part of a cross-section of the organic layer 14 illustrated in FIG. 4 and FIG. 5.

The display unit 1 of the present embodiment may be of a top-surface light emission type (a so-called top emission type), in which color light of any of R (red), G (green), and B (blue) is emitted from the top surface (the sealing substrate 19 facing the substrate 111) by using the EL element 10W described above and a color filter described later. As illustrated in FIG. 4, in the display region 110A, a light-emitting element formation layer 12 including the EL element 10W is formed on a base 11 in which the pixel-driving-circuit formation layer 112 is provided on the substrate 111. On the EL element 10W, a moisture-proof film 17, the filling layer 18, and the sealing substrate 19 are provided in this order. The display region 110A and the peripheral region 110B are partitioned by a seal section 23 provided along a peripheral edge section on a counter surface 19S of the sealing substrate 19, the counter surface 19S facing the substrate 111. In the EL element 10W, the first electrode layer 13 serving as an anode electrode, the organic layer 14 including a luminous layer 14C (described later), and the second electrode layer 16 serving as a cathode electrode are laminated in this order on a planarizing film 218 which is the uppermost layer of the pixel-driving-circuit formation layer 112. The organic layer 14 and the first electrode layer 13 are separated for each of the EL elements 10W, by the aperture-defining insulating film 24. It is to be noted that the planarizing film 218 and the aperture-defining insulating film 24 may be both configured using, for example, an organic material with excellent pattern precision such as polyimide, acrylic, and siloxane. Meanwhile, the second electrode layer 16 is provided as a layer common to all the EL elements 10W. It is to be noted that illustration of a detailed configuration including the drive transistor Tr1 and the write transistor Tr2 in the pixel-driving-circuit formation layer 112 is omitted in FIG. 4.

In the base 11, the pixel-driving-circuit formation layer 112 including the pixel driving circuit 140 is provided on the substrate 111. The substrate 111 is a support in which the EL elements 10W are formed in arrays, and a material such as a film or a sheet made of quartz, glass, metallic foil, or resin, for example, may be used for the substrate 111. Among them, quartz and glass are preferable. In a case of using resin as the material, examples may include methacryl resins represented by polymethyl methacrylate (PMMA), polyesters such as polyethylene terephthalate (PET), polyethylene naphthalate (PEN), and polybutylene naphthalate (PBN), and polycarbonate resin. In this case, however, a laminated structure and a surface treatment which suppress permeability and gas permeability may be necessary. On a surface of the substrate 111, a metal layer 211G serving as a gate electrode of the drive transistor Tr1, a metal layer 221G (FIG. 5) serving as a gate electrode of the write transistor Tr2, and the signal line 120A (FIG. 5) are provided as metal layers of a first level layer. The metal layers 211G and 221G as well as the signal line 120A are covered with a gate insulating film 212 which may be made of a silicon nitride, a silicon oxide, or the like.

In regions on the gate insulating film 212, the regions corresponding to the metal layers 211G and 221G, channel layers 213 and 223 which may be made of a semiconductor film formed of amorphous silicon or the like are provided, respectively. On the channel layers 213 and 223, insulating channel protective films 214 and 224 are provided to occupy channel regions 213R and 223R which are central regions of the channel layers 213 and 223, respectively. Provided on both sides of the channel protective film 214 are a drain electrode 215D and a source electrode 215S, and also, provided on both sides of the channel protective film 224 are a drain electrode 225D and a source electrode 225S. The drain electrodes 215D and 225D as well as the source electrodes 215S and 225S may be made of an n-type semiconductor film such as n-type amorphous silicon. The drain electrode 215D and the source electrode 215S are separated from each other by the channel protective film 214, and also, the drain electrode 225D and the source electrode 225S are separated from each other by the channel protective film 224. End faces of the drain electrode 215D and the source electrode 215S are apart from each other with the channel region 213R interposed therebetween, and also, end faces of the drain electrode 225D and the source electrode 225S are apart from each other with the channel region 223R interposed therebetween. Further, as metal layers of a second level layer, metal layers 216D and 226D serving as drain wiring as well as metal layers 216S and 226S serving as source wiring are provided to cover the drain electrodes 215D and 225D as well as the source electrodes 215S and 225S, respectively. The metal layers 216D and 226D as well as the metal layers 216S and 226S each may have, for example, a structure in which a titanium (Ti) layer, an aluminum (Al) layer, and a titanium layer are laminated in this order. Other than the metal layers 216D and 226D as well as the metal layers 216S and 226S, the scanning line 130A (not illustrated) is also provided as the metal layer of the second level layer. The metal layer 216S may be connected to connection wiring 31 used for connection with an external element such as an FPC in the peripheral region 110B (FIG. 4).

The pixel driving circuit 140 may be entirely covered with a protective film (a passivation film) 217 which may be made of, for example, an inorganic material of low water permeability, such as silicon oxide (SiOx), silicon nitride (SiNx), silicon oxynitride (SiNxOy), titanium oxide (TiOx), and aluminum oxide (AlxOy). On the protective film 217, the planarizing film 218 having an insulation property is provided. Preferably, the planarizing film 218 may have extremely high surface smoothness. Further, the contact section 124 which is minute is provided in a partial region of the planarizing film 218 and the protective film 217 (FIG. 4). The contact section 124 is filled with the first electrode layer 13, so that conduction with the metal layer 216S forming the source electrode of the drive transistor Tr1 is established.

The first electrode layer 13, which is a lower electrode formed on the planarizing film 218, also functions as a reflective layer, and preferably, may be configured using a material having highest possible reflectance in order to increase luminous efficiency. Therefore, the first electrode layer 13 may be configured using, for example, a high reflectance material such as aluminum (Al) and aluminum neodymium alloy (AlNd). The first electrode layer 13 may be, for example, a layer whose thickness in a lamination direction (hereinafter simply referred to as the thickness) is about 10 nm or more and 1,000 nm or less. The material of the first electrode layer 13 is not limited to those mentioned above, and may be a simple substance or an alloy of metallic elements such as chromium (Cr), gold (Au), platinum (Pt), nickel (Ni), copper (Cu), tungsten (W), and silver (Ag). Further, the first electrode layer 13 may have a laminated structure including a metal film and a transparent conductive film. The metal film may be made of a simple substance or an alloy of metallic elements described above, and the transparent conductive film may be made of indium tin oxide (ITO), indium zinc oxide (InZnO), a compound of zinc oxide (ZnO) and aluminum (Al), or the like.

The aperture-defining insulating film 24 is provided to fill a gap between the first electrode layer 13 as well as the organic layer 14 in the EL element 10W and those in the EL element 10W next thereto, i.e. a gap between the light-emitting sections 20. The aperture-defining insulating film 24 is also called a partition, which secures insulation between the first electrode layer 13 and the second electrode layer 16, and defines an outline of the light-emitting section 20 of the EL element 10W precisely. In other words, a light emission region is defined by the aperture-defining insulating film 24. The aperture-defining insulating film 24 further has a function of serving as a partition when ink-jet coating or nozzle coating is performed in a manufacturing process described later. It is to be noted that, although the organic layer 14 and/or the second electrode layer 16 may be provided not only on an aperture but also on the aperture-defining insulating film 24, light emission occurs in only the light-emitting section 20 corresponding to the aperture of the aperture-defining insulating film 24.

The organic layer 14 may be seamlessly formed over the entire surface of the light-emitting section 20 defined by the aperture-defining insulating film 24. The organic layer 14 may have a configuration in which a hole injection layer 14A, a hole transport layer 14B, the luminous layer 14C, and an electron transport layer 14D are laminated in this order from the first electrode layer 13 side as illustrated in FIG. 6, for example. However, layers other than the luminous layer 14C may be provided as necessary.

The hole injection layer 14A is provided to increase hole injection efficiency for the luminous layer 14C, and also serves as a buffer layer used to prevent leakage. The hole injection layer 14A may have a thickness of, for example, preferably about 5 nm to about 100 nm, and more preferably about 8 nm to about 50 nm. A material of the hole injection layer 14A may be selected as appropriate considering a relationship with an electrode or a material of an adjacent layer. Examples of the material of the hole injection layer 14A may include polyaniline, polythiophene, polypyrrole, polyphenylene vinylene, polythienylene vinylene, polyquinoline, polyquinoxaline as well as their derivatives, electroconductive polymers such as a polymer including an aromatic amine structure in a main chain or a side chain, metallophthalocyanine (such as copper phthalocyanine), and carbon. In a case in which the material used for the hole injection layer 14A is a polymer material, a weight-average molecular weight (Mw) thereof may be in a range of about 10,000 to about 300,000, and in particular, may be preferably in a range of about 5,000 to about 200,000. Further, an oligomer of about 2,000 to about 10,000 Mw may be used, but when Mw is less than 5,000, the hole injection layer might dissolve at the time of forming the hole transport layer and subsequent layers. When Mw exceeds 300,000, film formation is likely to be difficult because the material gels. Examples of a typical electroconductive polymer used as the material of the hole injection layer 14A may include polyaniline, oligoaniline, and polydioxythiophene such as poly(3, 4-ethylenedioxythiophene) (PEDOT). Other examples may include a polymer commercially available under the name "Nafion" (trademark) from H. C. Starck GmbH located in Goslar, Germany, a polymer commercially available in a dissolved form under the product name "Liquion" (trademark), "EL source" (trademark) available from Nissan Chemical Industries, Ltd. located in Tokyo, Japan, and a conductive polymer available under the name "Verazol" (trademark) from Soken Chemical & Engineering, Co., Ltd. located in Tokyo, Japan.

The hole transport layer 14B is provided to increase hole transport efficiency for the luminous layer 14C. The hole transport layer 14B may have, for example, a thickness of preferably about 10 nm to about 200 nm, and more preferably about 15 nm to about 150 nm, depending on the entire configuration of the element. As a polymer material of the hole transport layer 14B, a luminescent material soluble in an organic solvent may be used. Examples of this luminescent material may include polyvinylcarbazole, polyfluorene, polyaniline, polysilane as well as their derivatives, polysiloxane derivatives having an aromatic amine in a main chain or a side chain, polythiophene as well as derivatives thereof, and polypyrrole. When the material used for the hole transport layer 14B is a polymer material, a weight-average molecular weight (Mw) thereof may be preferably about 50,000 to about 300,000, and may be more preferably about 100,000 to about 200,000. When Mw is less than 50,000, a low-molecular component of the polymer material is dropped at the time of forming the luminous layer 14C, causing a dot in the hole injection layer 14A and the hole transport layer 14B, and therefore, it is likely that initial performance of the organic EL element is reduced or the element deteriorates. On the other hand, when Mw exceeds 300,000, it may be difficult to form a film because the material gels. It is to be noted that the weight-average molecular weight (Mw) is a value obtained by determining a weight-average molecular weight based on a polystyrene conversion, through Gel Permeation Chromatography (GPC), by using tetrahydrofuran as a solvent.

The luminous layer 14C generates light when electron-hole recombination is caused by application of an electric field. The luminous layer 14C may have a thickness of, for example, preferably about 10 nm to about 200 nm, and more preferably about 15 nm to about 150 nm, depending on the entire configuration of the element. The luminous layer 14C may be configured using a mixed material in which a low-molecular material is added to a polymer (luminescent) material. Preferably, the low-molecular material may be a monomer or an oligomer formed by combining about two to ten units of this monomer, and may have a weight-average molecular weight of 50,000 or less. It is to be noted that this does not necessarily exclude low-molecular materials having weight-average molecular weights falling outside the above-mentioned ranges. The luminous layer 14C may be formed by, for example, a coating method such as ink-jet coating. The luminous layer 14C may be formed by using a mixture in which at least one of polymer materials and low-molecular materials is dissolved in an organic solvent such as toluene, xylene, anisole, cyclohexanone, mesitylene (1,3,5-trimethylbenzene), pseudocumene(1,2,4-trimethylbenzene), hydrobenzofuran, 1,2,3,4-tetramethylbenzene, tetralin, cyclohexylbenzene, 1-methylnaphthalene, p-anisyl alcohol, dimethylnaphthalene, 3-methylbiphenyl, 4-methylbiphenyl, 3-isopropyl biphenyl, and monoisopropylnaphthalene. As the polymer material of the luminous layer 14C, thereby may be used, for example, a polyfluorene-based polymer derivative, a (poly)para-phenylene vinylene derivative, a polyphenylene derivative, a polyvinylcarbazole derivative, a polythiophene derivative, a perylene-based pigment, a coumarin-based pigment, a rhodamine-based pigment, or any of these polymers doped with an organic EL material. Examples of this doping material may include rubrene, perylene, 9,10 diphenyl anthracene, tetraphenylbutadiene, nile red, and coumarin 6.

Further, preferably, a low-molecular material may be added to the polymer material of the luminous layer 14C. The low-molecular material added to the luminous layer 14C may be a material other than compounds made of molecules of high-molecular-weight polymer or condensation product that is produced as a result of repetition of the same chain-reaction or a similar chain-reaction by a low-molecular compound, i.e. a material whose molecular weight is substantially single. In addition, a new chemical bond between molecules by heating does not occur, and the material exists in the form of single molecule. Preferably, such a low-molecular material may have a weight-average molecular weight (Mw) of 50,000 or less. This is because, as compared with materials of above 50,000 Mw, materials whose molecular weight is small to some extent have various characteristics, and it is easy to adjust factors such as hole or electron mobility, a band gap, and solubility in a solvent. Further, preferably, for the amount of the low-molecular material added, a mixing ratio of the polymer material and the low-molecular material used for the luminous layer 14C may be about 10:1 or more and about 1:2 or less in weight ratio thereof. Some reasons for this are as follows. When the mixing ratio of the polymer material and the low-molecular material is below 10:1, an effect produced by the addition of the low-molecular material is low. On the other hand, when this mixing ratio is above 1:2, it is difficult to obtain characteristics of the polymer material serving as the luminescent material. Usable examples of such a low-molecular material may include benzine, styrylamine, triphenyl amine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene as well as their derivatives, and a monomer or an oligomer in a conjugated heterocyclic system such as a polysilane-based compound, a vinylcarbazole-based compound, a thiophene-based compound, and an aniline-based compound. More specific examples may include, but not limited to, alpha-naphthyl phenyl phenylenediamine, porphyrin, metallotetraphenylporphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano 4,4,4-tris(3-methyl phenyl phenylamino)triphenyl amine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(para-phenylene vinylene), poly(thiophene vinylene), and poly(2,2'-thienyl pyrrole). It is to be noted that the low-molecular material added to the luminous layer 14C may not be only one kind, and two or more kinds may be mixed and used.

As a luminous guest material of the luminous layer 14C, there may be used a material having high luminous efficiency, examples of which may include a low-molecular luminescence material and an organic luminescent material such as a phosphorescent dye and a metal complex. Here, a luminous guest material for blue may be a compound whose wavelength range of light emission has a peak in a range of about 400 nm to about 490 nm. As such a compound, an organic substance such as a naphthalene derivative, an anthracene derivative, a naphthacene derivative, a styrylamine derivative, and a bis(azinyl)methane boron complex may be used. Among them, preferably, the compound may be selected from an aminonaphthalene derivative, an aminoanthracene derivative, an aminochrysene derivative, an aminopyrene derivative, a styrylamine derivative, and a bis(azinyl)methane boron complex.

The electron transport layer 14D is provided to increase electron transport efficiency for the luminous layer 14C. Examples of the material of the electron transport layer 14D may include quinoline, perylene, phenanthroline, bisstyryl, pyrazine, triazole, oxazole, fullerene, oxadiazole, fluorenone, and their derivatives as well as metal complexes. Specific examples may include tris(8-hydroxyquinoline)aluminum (abbreviated as Alq3), anthracene, naphthalene, phenanthrene, pyrene, anthracene, perylene, butadiene, coumarin, C60, acridine, stilbene, 1,10-phenanthroline, and their derivatives as well as metal complexes.

An electron injection layer (not illustrated), which may be made of LiF, $Li_2O$, or the like, may be provided between the electron transport layer 14D and the second electrode layer 16. This electron injection layer is used to increase electron injection efficiency, and may be provided over the entire surface of the electron transport layer 14D. As the material of this electron injection layer, there may be used lithium oxide ($Li_2O$) which is an oxide of lithium (Li), cesium carbonate ($Cs_2CO_3$) which is a complex oxide of cesium (Cs), and a mixture of these oxide and complex oxide, for example. The electron injection layer is not limited to the materials listed above. For instance, alkaline earth metals such as calcium (Ca) and barium (Ba), alkali metals such as lithium and cesium, and metals having small work function such as indium (In) and magnesium (Mg) may be used. Further, oxides, complex oxides, fluoride, and the like of these metals may be used as a simple substance. Furthermore, a mixture or an alloy of these metals, oxides, complex oxides, and fluoride may be used for increasing stability.

It is to be noted that the organic layer 14 may further include other hole transport layer in contact with the luminous layer 14C. This other hole transport layer may be formed by vapor deposition and thus, it is preferable to use a low-molecular material, in particular, a monomer. This is because polymerized molecules such as a polymer and an oligomer are likely to resolve during the vapor deposition. It is to be noted that the low-molecular material used for this other hole transport layer may be a mixture of two or more materials different in molecular weight. As the low-molecular material used for this other hole transport layer, a material similar to the low-molecular material described above for the luminous layer 14C may be used. Thus, likewise, examples may include, but not limited to, benzine, styrylamine, triphenyl amine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene as well as their derivatives, and a monomer, an oligomer, or a polymer in a conjugated heterocyclic system such as a polysilane-based compound, a vinylcarbazole-based compound, a thiophene-based compound, and an aniline-based compound. More specific material examples may include, but not limited to, alpha-naphthyl phenyl phenylenediamine, porphyrin, metallotetraphenylporphyrin, metal naphthalocyanine, hexacyanoazatriphenylene, 7,7,8,8-tetracyanoquinodimethane (TCNQ), 7,7,8,8'-tetracyano-2,3,5,6-tetrafluoroquinodimethane (F4-TCNQ), tetracyano 4,4,4-tris(3-methyl phenyl phenylamino)triphenyl amine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(para-phenylene vinylene), poly(thiophene vinylene), and poly(2,2'-thienyl pyrrole).

The second electrode layer 16 is a common electrode provided for two or more or all of the EL elements 10W, and disposed to face the first electrode layer 13 in each of the EL elements 10W. The second electrode layer 16 is formed to cover not only the organic layer 14 but the aperture-defining insulating film 24, and may have, for example, a thickness of about 2 nm or more and about 15 nm or less. The second electrode layer 16 is a transparent electrode configured using a conductive material having translucency to light generated in the luminous layer. Therefore, preferably, the material may be, for example, ITO, a compound containing indium, zinc (Zn), and oxygen (e.g., IZO), ZnO (zinc oxide), and the like. Further, the second electrode layer 16 may be, for example, a semi-permeable reflective film configured using a simple substance or an alloy of metallic elements such as aluminum (Al), magnesium (Mg), calcium (Ca), and sodium (Na). Suitable examples may include an alloy of magnesium and silver (MgAg alloy), and an alloy of aluminum (Al) and lithium (Li) (AlLi alloy). In a case of using an Mg—Ag alloy, preferably, Mg:Ag in film ratio may fall in a range from about 20:1 to about 1:1. Further, the second electrode layer 16 may be a mixed layer containing an organic luminescent material such as a quinoline aluminum complex, a styrylamine derivative, and a phthalocyanine derivative. In this case, a layer having optical transparency such as a layer made of MgAg may be further provided as a third layer.

The moisture-proof film 17 covering the EL element 10W may be made of, for example, an inorganic material having low hygroscopicity such as silicon oxide (SiOx), silicon nitride (SiNx), silicon oxynitride (SiNxOy), titanium oxide (TiOx), and aluminum oxide (AlxOy). Alternatively, a metallic material such as aluminum may be used. By providing the moisture-proof film 17, the EL element 10W is shielded from outside air, and entrance of water from an external environment into the EL element 10W inside is prevented. The moisture-proof film 17 is almost uniformly formed to cover not only the second electrode layer 16 but the aperture-defining insulating film 24 and the planarizing film 218 (described later). In other words, the moisture-proof film 17 may cover the EL element 10W, the aperture-defining insulating film 24, and the planarizing film 218 continuously from the display region 110A to the peripheral region 110B. However, it is sufficient for the moisture-proof film 17 to cover at least the aperture-defining insulating film 24 and the planarizing film 218 in the peripheral region 110B. This is because, since the aperture-defining insulating film 24 and the planarizing film 218 are both configured using the organic materials having high hygroscopicity as described above, it is necessary to prevent the water from entering the inside of the EL element 10W through these films. It is to be noted that when the aperture-defining insulating film 24 is not present in the peripheral region 110B, it is sufficient for the moisture-proof film 17 to cover the planarizing film 218. Further, the moisture-proof film 17 may have a single-layered structure, but may have a multilayer structure when increasing the thickness. This is to reduce internal stress in the moisture-proof film 17.

The filling layer 18 may be a transparent resin layer almost uniformly formed on the moisture-proof film 17, and functions as a bonding layer. This filling layer 18 may be made of epoxy resin, acrylic resin, or the like, for example, and may be preferably made of thermosetting resin, UV-curable resin, or the like. The filling layer 18 is sealed between the base 11 and the sealing substrate 19.

The seal section 23 is provided at an edge section of the sealing substrate 19, and formed like a loop surrounding the display region 110A. The seal section 23 is a member provided to seal each layer between the substrate 111 and the sealing substrate 19 from outside. This seal section 23 may also be made of, for example, a nonconductive material such as epoxy resin and acrylic resin. However, the seal section 23 may be formed of a conductive bonding material. In this case, the seal section 23 is allowed to function as auxiliary wiring preventing an outflow of the filling layer 18 as well as easing a drop in voltage of the second electrode layer 16.

The sealing substrate 19 seals the EL element 10W in corporation with the filling layer 18 and the seal section 23. The sealing substrate 19 may be configured using a material such as clear glass having high permeability to each color light emitted from a red pixel 10R, a green pixel 10G, and a blue pixel 10B. On a surface of this sealing substrate 19, the surface being on the substrate 111 side, the color filter (not illustrated) and a BM layer (a light-shielding film) may be provided, for example. The color filter may include a red filter, a green filter, and a blue filter. Thus, white light emitted from the EL element 10W in each of the red pixel 10R, the green pixel 10G, and the blue pixel 10B passes through the above-mentioned color filter of each color, so that red light, green light, and blue light exit therefrom. Further, the sealing substrate 19 improves contrast by absorbing external light reflected within the red pixel 10R, the green pixel 10G, and the blue pixel 10B as well as in the wiring therebetween. Furthermore, in the counter surface 19S in a region between the display region 110A and the peripheral region 110B, a vernier 32 and a black matrix 33 may be provided. The vernier 32 is used for alignment when bonding the sealing substrate 19. The black matrix 33 blocks unnecessary light. The red filter, the green filter, and the blue filter may be each shaped like a rectangle, for example, and may be formed seamlessly. The red filter, the green filter, and the blue filter may be each configured using resin mixed with a pigment, and so adjusted by selecting the pigment that optical transmittance in an intended red, green, or blue wavelength region is high while optical transmittance in other wavelength regions is low. Furthermore, a wavelength range having high transmittance in the color filter and a peak wavelength L (lambda) of a spectrum of light desired to be extracted from a resonator structure agree with each other. Thus, of external light entering from the sealing substrate 19, only light having a wavelength equal to the peak wavelength L of the spectrum of the light desired to be extracted passes through the color filter, and external light having other wavelengths is prevented from entering the EL element 10W.

The light-shielding film may be configured using, for example, a black resin film mixed with a black coloring agent and having an optical density of one or more, or a thin-film filter using thin-film interference. Use of the black resin film allows easy formation at low cost and thus may be preferable. The thin-film filter may be, for example, a filter in which a thin film made of metal, metal nitride, or metal oxide is laminated as one or more layers, and attenuates light by utilizing thin-film interference. As the thin-film filter, specifically, a filter in which chromium and chromium oxide (III) ($Cr_2O_3$) are alternately laminated may be used.

The display unit 1 may be manufactured as follows, for example. A method of manufacturing the display unit according to the present embodiment will be described below with reference to FIG. 4 to FIG. 6.

First, on the substrate 111 made of the material described above, the pixel driving circuit 140 including the drive transistor Tr1 and the write transistor Tr2 is formed. Specifically, first, a metal film is formed on the substrate 111 by sputtering, for example. Next, the metal layers 211G and 221G and a part of the signal line 120A are formed on the substrate 111 by patterning the metal film through use of, for example, a photolithographic method, dry etching, or wet etching. Subsequently, the entire surface is covered with the gate insulating film 212. Further, the channel layers, the channel protective films, the drain electrodes as well as the source electrodes, and the metal layers 216D and 226D as well as the metal layers 216S and 226S are formed, on the gate insulating film 212, in this order into a predetermined shape. Here, a part of the signal line 120A and the scanning line 130A are each formed as a second metal layer, together at the time of forming the metal layers 216D and 226D as well as the metal layers 216S and 226S. In this process, a connection section connecting the metal layer 221G and the scanning line 130A, a connection section connecting the metal layer 226D and the signal line 120A, and a connection section connecting the metal layer 226S and the metal layer 211G are formed beforehand. Subsequently, the protective film 217 is provided to cover the whole, which completes the pixel driving circuit 140. In this process, the aperture is formed in the protective film 217 by dry etching or the like, at a predetermined position on the metal layer 216S.

After the pixel driving circuit 140 is formed, a photosensitive resin which may contain polyimide as a main component, for example, is applied over the entire surface by spin coating or the like. Next, the planarizing film 218 having the contact section 124 is formed by subjecting the photosensitive resin to photolithography. Specifically, the contact section 124 which is in communication with the aperture provided in the protective film 217 is formed by, for example, selective exposure and development using a mask having a hole at a predetermined position. Afterward, the planarizing film 218 may be subjected to firing as necessary. The pixel-driving-circuit formation layer 112 is thereby obtained.

Further, the first electrode layer 13 made of the predetermined material described above is formed. Specifically, after a metal film made of the above-described material is formed over the entire surface by, for example, sputtering, a resist pattern (not illustrated) in a predetermined shape is formed on this laminated film by using a predetermined mask. Furthermore, the metal film is selectively etched using the resist pattern as a mask. In this process, the first electrode layer 13 is formed to cover the surface of the planarizing film 218 and fill the contact section 124.

Next, the aperture-defining insulating film 24 is formed to fill a gap between the first electrode layers 13 next to each other. Specifically, a film of an inorganic insulating material such as $SiO_2$ may be formed by CVD (Chemical Vapor Deposition), for example, on the first electrode layer 13 and the planarizing film 218, for example. This film is then patterned using a photolithography technique and an etching technique, so that a lower aperture-defining insulating film is formed. An upper aperture-defining insulating film made of the described-above photosensitive resin is formed at a predetermined position of the lower aperture-defining insulating film, specifically, at a position surrounding the light emission region of the pixel. Thus, the aperture-defining insulating film 24 including the upper aperture-defining insulating film and the lower aperture-defining insulating film is formed.

After the aperture-defining insulating film 24 is formed, the surface of the base 11 is subjected to an oxygen plasma treatment, the surface being on the side where the first electrode layer 13 and the aperture-defining insulating film 24 are formed, so that contaminants such as organic matters attached to the surface are removed to improve wettability. Specifically, the base 11 may be heated to a predetermined temperature, e.g., about 70 degrees C. to about 80 degrees C., and then, the plasma treatment in which oxygen is used as reactant gas under atmospheric pressure (i.e. an $O_2$ plasma treatment) is performed.

Following the plasma treatment, a water-repellent treatment (a liquid-repellent treatment) is performed to reduce, in particular, wettability on a top surface and a side surface of the upper aperture-defining insulating film. Specifically, this may be performed as follows. First, a plasma treatment (a $CF_4$ plasma treatment) in which tetrafluoromethane is used as reactant gas under atmospheric pressure is performed.

Subsequently, the top surface and the side surface of the upper aperture-defining insulating film are caused to be liquid repellent by cooling the base 11, which has been heated for the plasma treatment, to ambient temperature, so that the wettability thereof is reduced. In it is to be noted that in this $CF_4$ plasma treatment, an exposed surface of the first electrode layer 13 and the lower aperture-defining insulating film may also be affected to some extent. However, in the $CF_4$ plasma treatment, materials such as ITO which is the material of the first electrode layer 13 and $SiO_2$ which is the material of the lower aperture-defining insulating film have a low affinity to fluorine and therefore, the wettability improved by the oxygen plasma treatment is maintained as it is.

Next, the organic layer 14 may be formed by laminating the hole injection layer 14A, the hole transport layer 14B, the luminous layer 14C, and the electron transport layer 14D made of the predetermined materials and having thicknesses described above, by vapor deposition, for example, in this order. These layers are formed to completely cover an exposed part of the first electrode layer 13, in a region surrounded by the upper aperture-defining insulating film. Further, the second electrode layer 16 is formed over the entire surface, so as to face the first electrode layer 13 with the organic layer 14 interposed therebetween. Subsequently, the second electrode layer 16 is patterned into a predetermined shape, so that the EL element 10W is obtained.

The hole injection layer 14A may be formed using a coating method such as spin coating or a droplet discharge method, other than vapor deposition. In this case, in particular, considering it is necessary to selectively arrange the material used in forming the hole injection layer 14A in the region surrounded by the upper aperture-defining insulating film, preferably, an inkjet method which is a droplet discharge method, or nozzle coating may be used.

Subsequently, the moisture-proof film 17 made of the material described above may be formed using a film formation method in which energy of film-formation particles is small to the extent of not affecting a base layer, such as vapor deposition and CVD. For instance, when the moisture-proof film 17 made of amorphous silicon nitride is formed, the moisture-proof film 17 is formed by CVD to have a film thickness of about 2 micrometer to about 3 micrometer. In this process, preferably, in order to prevent the luminance from declining due to deterioration of the organic layer 14, a film formation temperature may be set to room temperature, and the film may be formed on condition that stress of the film is minimized to prevent the moisture-proof film 17 from peeling off. Further, preferably, the electron transport layer 14D, an electron injection layer 14E, the second electrode layer 16, and the moisture-proof film 17 may be formed sequentially in the same film forming apparatus without being exposed to the atmosphere. This prevents deterioration of the organic layer 14 due to atmospheric water.

Finally, the filling layer 18 is provide on the moisture-proof film 17 and bonded to the sealing substrate 19 with the seal section 23 interposed therebetween. This completes the display unit 1.

(Function and Effects of Display Unit 1)

In this display unit 1, a scanning signal is supplied from the scanning-line driving circuit 130 to each pixel through the gate electrode of the write transistor Tr2, and an image signal supplied from the signal-line driving circuit 120 is retained at the capacitor Cs through the write transistor Tr2. In other words, the drive transistor Tr1 is controlled to be ON/OFF according to this signal held by the capacitor Cs, and thereby a driving current Id is injected into the EL element 10W so that electron-hole recombination occurs, which causes emission of light. Since the display unit 1 may be of the top-surface light emission type (the top emission type), this light is taken out upon passing through the second electrode layer 16, the moisture-proof film 17, the filling layer 18, the color filter (not illustrated) of each color, and the sealing substrate 19. Image display (color image display) is thus performed in the display unit 1.

In a typical organic EL display unit, for example, an organic layer in an organic EL element is deteriorated by moisture absorption, leading to a decrease in light emission intensity or instability of light emission in the organic EL element. Therefore, disadvantages such as low stability over time and a short life have been pointed out.

In contrast, in the present embodiment, the planarizing film 218 in the peripheral region 110B is covered with the moisture-proof film 17. Therefore, the planarizing film 218 serving as the base layer of the EL element 10W is sufficiently shielded from outside air containing water. As a result, it is possible to effectively prevent entrance of water from the peripheral region 110B into the display region 110A, while providing a simple configuration. Therefore, deterioration in the light-emitting element due to water is suppressed, achieving high operational reliability. Moreover, it is also possible to achieve a slim bezel since it is not necessary to increase the distance between the display region and the peripheral region, unlike the structure proposed in each of Japanese Unexamined Patent Application Publications No. 2006-54111 and No. 2008-283222.

<Modifications>

Now, modifications (first to sixth modifications 1 to 6) of the above-described embodiment will be described. It is to be noted that the same elements as those of the above-described embodiment are provided with the same reference numerals as those of the above-described embodiment, and the description thereof will be omitted as appropriate.

<Modification 1>

FIG. 7 illustrates a cross-sectional configuration of a display unit 1A according to the modification 1. In the present modification, a moisture-proof film 25 is provided between the protective film 217 and the planarizing film 218, and a moisture-proof film 26 is provided between the planarizing film 218 and the aperture-defining insulating film 24. The present modification is otherwise similar to the above-described embodiment in terms of configuration. The moisture-proof films 25 and 26 are both made of an inorganic material having low hygroscopicity as with the moisture-proof film 17, and extend from an edge of the planarizing film 218 and an edge of the aperture-defining insulating film 24, respectively, toward the display region 110A. Providing the moisture-proof films 25 and 26 in addition to the moisture-proof film 17 reliably prevents entrance of water from an external environment into the EL element 10W. This is because it is possible to reliably block the water which is otherwise likely to reach the EL element 10W after passing through a boundary between the protective film 217 and the planarizing film 218 or a boundary between the planarizing film 218 and the aperture-defining insulating film 24.

<Modifications 2 to 4>

FIG. 8, FIG. 9A, and FIG. 9B illustrate cross-sectional configurations of organic EL display units (hereinafter simply referred to as the display units) 1B, 1C1, and 1C2 according to the modifications 2 to 4, respectively. Further, FIG. 9C illustrates an enlarged cross-sectional configuration of a main part of a display unit 1C3 according to the modification 5. The modifications 2 to 5 are each provided with a separation groove 27 in a region corresponding to the seal section 23, and each have otherwise a configuration similar to that of the above-described embodiment. The separation groove 27 extends like a loop surrounding the display region 110A on an XY plane, in a manner similar to the seal section 23. The separation groove 27 separates the aperture-defining insulating film 24 and the planarizing film 218 provided in the display region 110A from the aperture-defining insulating film 24 and the planarizing film 218 provided in the peripheral region 110B. A bottom of the separation groove 27 reaches the protective film 217. The separation groove 27 is filled with the moisture-proof film 17 (a moisture-proof film 29 in the display unit 1C3). In particular, in the display unit 1B (the modification 2), the moisture-proof film 17 directly covers an internal surface of the separation groove 27. In each of the display units 1C1, 1C2, and 1C3 (the modifications 3 to 5), a metal film 28 is further provided to cover an internal surface and a bottom surface of the separation groove 27. It is to be noted that this metal film 28 may be, for example, made of the same material as that of the second electrode layer 16 and provided integrally with the second electrode layer 16, as exemplified by the display unit 1C2 illustrated in FIG. 9B. Alternatively, as exemplified by the display units 1C1 and 1C3 illustrated in FIGS. 9A and 9C, respectively, when the metal film 28 is formed independently of the second electrode layer 16, a material different from that of the second electrode layer 16 may be selected. Still alternatively, as exemplified by the display unit 1C3, the moisture-proof film 29 in a three-layer structure may be provided as a film independent of the moisture-proof film 17 covering the aperture-defining insulating film 24 and the second electrode layer 16 in the display region 110A. This moisture-proof film 29 fills the inside of the separation groove 27 and covers the protective film 217 and the planarizing film 218 in the peripheral region 110B. In the moisture-proof film 29, first to third layers 291 to 293 are laminated in this order on the protective film 217 and the planarizing film 218. The first and third layers 291 and 293 may be, for example, nitride films made of silicon nitride (SiNx) or the like, and the second layer 292 may be, for example, an oxide film made of silicon oxide (SiOx) or the like. Further, in each of the display units 1B, 1C1, 1C2, and 1C3, a plurality of separation grooves 27 may be provided.

In each of the display units 1B, 1C1, and 1C2, the separation groove 27 is provided in addition to the moisture-proof film 17 and therefore, entrance of water from an external environment into the EL element 10W is prevented more reliably. This is because the protective film 217 and the planarizing film 218 forming a traveling path of the water are disconnected by the display region 110A and the peripheral region 110B.

<Modification 6>

FIG. 10 illustrates a cross-sectional configuration of a display unit 1D according to the modification 6. The display unit 1D of the present modification has a moisture-proof film 34 in place of the moisture-proof film 17, and is otherwise similar to the above-described embodiment in terms of configuration. The moisture-proof film 34 is provided continuously from an end face of the substrate 111 to an end face of the sealing substrate 19, and seals a region including the EL element 10W interposed between the substrate 111 and the sealing substrate 19. The moisture-proof film 34 may be made of, for example, an inorganic material similar to that of the moisture-proof film 17.

In the display unit 1D, since the moisture-proof film 34 is provided, entrance of water from an external environment into the EL element 10W is prevented with reliability. This is because the planarizing film 218 and the aperture-defining insulating film 24 in the peripheral region 110B are covered with the moisture-proof film 34, and sufficiently shielded from outside air containing water. Further, when being formed of a conductive inorganic material, the moisture-proof film 34 is allowed to be used as a signal line. Such a conductive material may be, for example, a simple substance or an alloy of metallic elements such as platinum (Pt), gold (Au), silver (Ag), chromium (Cr), tungsten (W), nickel (Ni), copper (Cu), iron (Fe), cobalt (Co), tantalum (Ta), aluminum (Al), neodymium (Nd), and molybdenum (Mo). As such an alloy, for instance, an Ag—Pd—Cu alloy or an Al—Nd alloy may be used. The Ag—Pd—Cu alloy may contain silver as a main component and about 0.3 wt % to about 1 wt % of palladium (Pd) as well as about 0.3 wt % to about 1 wt % of copper. In this case, one end of the connection wiring 31 such as an FPC which establishes connection to outside may be embedded in the moisture-proof film 34. It is to be noted that the moisture-proof film 34 and the seal section 23 may be provided as a common element.

Application Examples

Application examples of the display units according to the embodiment and modifications described above (i.e. the display units 1, and 1A to 1D) will be described below. The display unit according to each of the above-described embodiment and the modifications is applicable to electronic apparatuses in all fields, which display externally-inputted image signals or internally-generated image signals as still or moving images. The electronic apparatuses may include, for example, television receivers, digital cameras, laptop computers, portable terminals such as portable telephones, video cameras, and the like.
(Module)
The display unit according to any of the above-described embodiment and the modifications may be incorporated, for instance, as a module illustrated in FIG. 11, into any of various kinds of electronic apparatuses such as first to sixth application examples 1 to 6 described later. This module may be formed, for example, by providing a region 210 exposed from the sealing substrate 19, etc., at one side of the substrate 111. In this exposed region 210, an external connection terminal (not illustrated) is formed by extending wiring of the signal-line driving circuit 120 and the scanning-line driving circuit 130. The external connection terminal may be provided with a flexible printed circuit (FPC) 220 for input and output of signals.

Application Example 1

FIG. 12 illustrates an appearance of a television receiver to which the display unit according to any of the above-described embodiment and the modifications is applied. This television receiver may have, for example, an image-display screen section 300 that includes a front panel 310 and a filter glass 320. The image-display screen section 330 is configured using the display unit according to any of the above-described embodiment and the modifications.

Application Example 2

FIGS. 13A and 13B each illustrate an appearance of a digital camera to which the display unit according to any of the above-described embodiment and the modifications is applied. This digital camera may include, for example, a flash emitting section 410, a display section 420, a menu switch 430, and a shutter release 440. The display section 420 is configured using the display unit according to any of the above-described embodiment and the modifications.

Application Example 3

FIG. 14 illustrates an appearance of a laptop computer to which the display unit according to any of the above-described embodiment and the modifications is applied. This laptop computer may include, for example, a main body section 510, a keyboard 520 provided to enter characters and the like, and a display section 530 displaying an image. The display section 530 is configured using the display unit according to any of the above-described embodiment and the modifications.

Application Example 4

FIG. 15 illustrates an appearance of a video camera to which the display unit according to any of the above-described embodiment and the modifications is applied. This video camera may include, for example, a main body section 610, a lens 620 disposed on a front face of this main body section 610 to shoot an image of a subject, a start/stop switch 630 used in shooting, and a display section 640. The display section 640 is configured using the display unit according to any of the above-described embodiment and the modifications.

Application Example 5

FIGS. 16A and 16B each illustrate appearances of a portable telephone to which the display unit according to any of the above-described embodiment and the modifications is applied. This portable telephone may be, for example, a unit in which an upper housing 710 and a lower housing 720 are connected by a coupling section (a hinge section) 730, and may include a display 740, a sub-display 750, a picture light 760, and a camera 770. The display 740 or the sub-display 750 is configured using the display unit according to any of the above-described embodiment and the modifications.

Application Example 6

FIGS. 17A and 17B each illustrate an appearance configuration of a so-called tablet personal computer (PC). This tablet PC may include, for example, a display section 810, a non-display section 820 such as a housing supporting the display section 810, and an operation section 830 such as a power switch. It is to be noted that the operation section 830 may be provided either on a front face of the non-display section 820 as illustrated in FIG. 17A, or on a top surface of the same as illustrated in FIG. 17B. The display section 810 is a touch screen provided with a position input function (a pointing function) in addition to an image display function (a touch panel).
<Other Modifications>
The technology has been described with reference to the example embodiment and some modifications, but is not limited thereto, and may be variously modified. For example, in the above-described embodiment, the modifications, and the application examples, entrance of water into the EL element 10W is prevented by covering the planarizing film 218 and the like in the peripheral region 110B with the moisture-proof films 17 and/or 29, but the present disclosure is not limited thereto. For instance, as exemplified by a display unit 1E illustrated in FIG. 18, the separation groove 27 may be provided in a region corresponding to the seal section 23 in place of the moisture-proof film 17, the seal section 23 may be formed of a metallic material, and the separation groove 27 may be filled with a part of the seal section 23 (a seventh modification). As the metallic material applied to the seal section 23, there may be used, for example, a simple substance or an alloy of metallic elements such as platinum (Pt), gold (Au), silver (Ag), chromium (Cr), tungsten (W), nickel (Ni), copper (Cu), iron (Fe), cobalt (Co), tantalum (Ta), aluminum (Al), neodymium (Nd), and molybdenum (Mo). To be more specific, an Ag—Pd—Cu alloy or an Al—Nd alloy may be used. The Ag—Pd—Cu alloy may contain silver as a main component and about 0.3 wt % to about 1 wt % of palladium (Pd) as well as about 0.3 wt % to about 1 wt % of copper. Alternatively, a dumet wire (a copper wire using a nickel-iron alloy wire as a core (i.e. a nickel-iron alloy wire covered with copper)) may be applied to the seal section 23.

In the display unit 1E, since the separation groove 27 filled with a part of the seal section 23 made of the metallic material is provided, entrance of water from an external environment into the EL element 10W is prevented more reliably. Further, the seal section 23 is also allowed to be used as wiring. The seal section 23 may be formed using a mask, through vacuum vapor deposition, sputtering, ion plating, or plating, for example. Furthermore, when the dumet wire is used, the seal section 23 may be formed by welding the dumet wire by application of heat with a burner or the like. It is to be noted that at the time of forming the seal section 23, one end of leading wiring (not illustrated) such as an FPC establishing connection to outside may be embedded in the seal section 23.

Further, in the technology, as exemplified by a display unit 1F1 illustrated in FIG. 19A, for example, the separation groove 27 may be provided in a region corresponding to the seal section 23, an inner surface of the separation groove 27 may be covered with a metal layer 28, and the separation groove 27 may be filled with the moisture-proof film 17 (an eighth modification). Alternatively, as exemplified by a display unit 1F2 illustrated in FIG. 19B, the moisture-proof film 29 having a three-layer structure and filling the inside of the separation groove 27 may be provided independently of the moisture-proof film 17. In the moisture-proof film 29, first to third Layers 291 to 293 are laminated in this order. The first and third layers 291 and 293 may be both nitride films made of silicon nitride (SiNx) or the like, for example, and the second layer 292 may be an oxide film made of silicon oxide (SiOx) or the like (a ninth modification). Still alternatively, as exemplified by a display unit 1G illustrated in FIG. 20, two separation grooves 27A and 27B may be provided and filled with the metal layer 28 (a tenth modification).

In the technology, as exemplified by a display unit 1H1 illustrated in FIG. 21A, for example, the moisture-proof film 17 may be provided between the aperture-defining insulating film 24 and the organic layer 14 in the display region 110A (an eleventh modification). This makes it possible to prevent the EL element 10W from deteriorating due to water contained in the aperture-defining insulating film 24 in the display region 110A. Further, as exemplified by a display unit 1H2 illustrated in FIG. 21B, the moisture-proof film 26 may be also provided between the planarizing film 218 and the aperture-defining insulating film 24 (a twelfth modification). It is to be noted that, in order to form each of the display units 1H1 and 1H2, after the aperture-defining insulating film 24 is formed, a predetermined material (e.g. SiN) having a moisture resistance property and an insulation property may be formed to cover the aperture-defining insulating film 24 by CVD, a lithography method, and etching. Subsequently, the organic layer 14 may be formed by, for example, vapor deposition, and then, the second electrode layer 16 is formed to obtain each of the display units 1H1 and 1H2.

Further, in the technology, as exemplified by a display unit 1J illustrated in FIGS. 22A and 22B (a thirteenth modification), for example, a moisture-proof film 35 made of insulating resin having high moisture resistance may be provided in place of the moisture-proof film 17. In the display unit 1J, the moisture-proof film 35 continuously extends from an end face of the substrate 111 to an end face of the sealing substrate 19, and seals a region including the EL element 10W interposed between the substrate 111 and the sealing substrate 19. As illustrated, for example, in FIG. 23, a predetermined resin is applied along an outer edge of the sealing substrate 19 and then hardened to form the moisture-proof film 35 so that the display unit 1J is obtained. Furthermore, as exemplified by a display unit 1K illustrated in FIGS. 24 and 24B (a fourteenth modification), for example, the moisture-proof film 35 in a two-layer structure may be provided by forming a resin layer 351, and then forming an inorganic layer 352 by depositing an inorganic material on the resin layer 351 by sputtering or the like. It is to be noted that the moisture-proof film 35 may be formed by directly depositing an inorganic material or a metallic material without forming the resin layer. For this inorganic material, an inorganic material having low hygroscopicity such as silicon oxide (SiOx), silicon nitride (SiNx), silicon oxynitride (SiNxOy), silicon carbide (SiCx), titanium oxide (TiOx), and aluminum oxide (AlxOy) may be suitable. Meanwhile, for the metallic material, a simple substance or an alloy of metallic elements such as platinum (Pt), gold (Au), silver (Ag), chromium (Cr), tungsten (W), nickel (Ni), copper (Cu), iron (Fe), cobalt (Co), tantalum (Ta), titanium (Ti), aluminum (Al), neodymium (Nd), and molybdenum (Mo) may be suitable. Specifically, for example, an Ag—Pd—Cu alloy, an Al—Nd alloy, and a dumet wire (a copper wire using a nickel-iron alloy wire as a core (i.e. a nickel-iron alloy wire covered with copper)) and the like may be suitable. The Ag—Pd—Cu alloy may contain silver as a main component and about 0.3 wt % to about 1 wt % of palladium (Pd) as well as about 0.3 wt % to about 1 wt % of copper. Still furthermore, as exemplified by a display unit 1L illustrated in FIG. 25 (a fifteenth modification), for example, a region including the EL element 10W between the substrate 111 and the sealing substrate 19 may be sealed by a glass layer 37. The display unit 1L may be obtained as follows. After fritted glass is applied along an outer edge of the substrate 111, the substrate 111 and the sealing substrate 19 are welded by forming a moisture-proof film 37 made of a glass layer by irradiation of the fritted glass with a laser as illustrated FIG. 26, for example. Moreover, as exemplified by a display unit 1M illustrated in FIG. 27 (a sixteenth modification), for example, the moisture-proof films 35 and 37 may be each formed after processing the respective end faces of the substrate 111 and the sealing substrate 19 into a concave shape.

Further, in the technology, the separation groove 27 may be provided in a region corresponding to the seal section 23 in place of the moisture-proof film 17, and an inner surface of the separation groove 27 may be covered with the metal layer 28 and a moisture-proof film in a three-layer structure. The moisture-proof film in the three-layer structure may be a film in which, for example, an oxide film made of silicon oxide (SiOx) or the like may be interposed between a pair of nitride films made of silicon nitride (SiNx) or the like, or interposed between a pair of carbide films made of silicon carbide (SiCx) or the like. Alternatively, the moisture-proof film in the three-layer structure may be a film in which a nitride film made of silicon nitride (SiNx) or the like or a carbide film made of silicon carbide (SiCx) or the like may be interposed between a pair of oxide films made of silicon oxide (SiOx) or the like. Still alternatively, the moisture-proof film in the three-layer structure may be a film in which, for example, an oxide film made of silicon oxide (SiOx) or the like may be interposed between a pair of nitride films made of silicon nitride (SiNx) or the like. It is to be noted that extending the moisture-proof film in the three-layer structure up to the peripheral region 110B and covering the planarizing film 218 with the moisture-proof film 34 improves the moisture resistance property, which is thus preferable.

Further, in the above-described embodiment, the case in which all the organic light-emitting elements emit white light and each color light is extracted through the color filter provided separately has been taken as an example, but the technology is not limited thereto. For instance, the organic light-emitting elements emitting red light, green light, and blue light, respectively, may be provided by assigning different colors for the organic layers 14 by using predetermined materials.

Alternatively, the display unit may have a configuration in which red light, green color light, blue light, and yellow light are taken out by using organic light-emitting elements 10Y and 10B emitting yellow light and blue light, respectively, and color filters of red, green, blue, and yellow. Still alternatively, the display unit may have a configuration in which red light, green color light, and blue light are taken out by using organic light-emitting elements 10Y and 10B emitting yellow light and blue light, respectively, and color filters of red, green, and blue.

Moreover, the technology is not limited to the material, lamination order, film formation method, or the like of each of the layers described above in the example embodiment, the modifications, and the application examples. For instance, although the case in which the first electrode layer 13 is provided as an anode and the second electrode layer 16 is provided as a cathode has been described in the embodiment, the first electrode layer 13 may be provided as a cathode and the second electrode layer 16 may be provided as an anode. It is to be noted that when the first electrode layer 13 is used as a cathode, preferably, the first electrode layer 13 may be configured using a material having a high hole injection property. However, a material having an obstacle to hole injection due to existence of an oxide film on the surface or a small work function, such as an aluminum alloy, may be used for the first electrode layer 13 by providing an appropriate hole injection layer. Furthermore, although the example embodiment, the modifications, and the application examples have been described with reference to the specific configuration of the light-emitting section 20, other layer may be further provided. For instance, a hole-injection thin-film layer which may be made of chromium oxide (III) ($Cr_2O_3$), ITO (Indium-Tin Oxide: an oxide-mixed film of indium (In) and tin (Sn)), or the like may be provided between the first electrode layer 13 and the organic layer 14.

Furthermore, the technology encompasses any possible combination of some or all of the various embodiments described herein and incorporated herein.

It is possible to achieve at least the following configurations from the above-described example embodiments of the disclosure.

(1) A display unit, including:
a first substrate and a second substrate that are disposed to face each other;
a first organic insulating layer provided on the first substrate;
a plurality of light-emitting elements arrayed in a display region, the display region being provided on the first organic insulating layer and facing the second substrate; and
a first moisture-proof film covering the first organic insulating layer in a peripheral region, the peripheral region being provided on the first substrate and surrounding the display region.

(2) The display unit according to (1), further including a second organic insulating layer provided on the first organic insulating layer, the second organic insulating layer separating the light-emitting elements from one another and defining light emission regions of the light-emitting elements,
wherein the first moisture-proof film covers the second organic insulating layer in the peripheral region.

(3) The display unit according to (2), wherein the first moisture-proof film covers the second organic insulating layer in the display region.

(4) The display unit according to any one of (1) to (3), wherein the first moisture-proof film covers the first organic insulating layer continuously from the display region to the peripheral region.

(5) The display unit according to any one of (1) to (4), further including a second moisture-proof film provided between the first organic insulating layer and the second organic insulating layer.

(6) The display unit according to any one of (1) to (5), further including:
an inorganic insulating layer provided between the first substrate and the first organic insulating layer; and
a third moisture-proof film provided between the inorganic insulating layer and the first organic insulating layer.

(7) The display unit according to any one of (1) to (6), wherein the first moisture-proof film includes one of a silicon nitride represented by SiNx and a metallic material.

(8) The display unit according to any one of (1) to (7), further including a separation groove that separates the first organic insulating layer provided in the display region from the first organic insulating layer provided in the peripheral region.

(9) The display unit according to (8), wherein the first moisture-proof film covers an inner surface of the separation groove.

(10) The display unit according to (8), further including a metallic material layer that covers an inner surface of the separation groove.

(11) The display unit according to any one of (1) to (10), further including a seal section provided along a peripheral edge section on a counter surface of the second substrate and partitioning the display region and the peripheral region, the counter surface facing the first substrate.

(12) The display unit according to (11), wherein the seal section includes a conductive material.

(13) The display unit according to any one of (1) to (12), wherein the first moisture-proof film is provided from an end face of the first substrate to an end face of the second substrate, and seals a region provided between the first substrate and the second substrate.

(14) The display unit according to (13), wherein the first moisture-proof film includes one of a metallic material and an inorganic insulating material.

(15) An electronic apparatus provided with a display unit, the display unit including:
a first substrate and a second substrate that are disposed to face each other;
a first organic insulating layer provided on the first substrate;
a plurality of light-emitting elements arrayed in a display region, the display region being provided on the first organic insulating layer and facing the second substrate; and
a first moisture-proof film covering the first organic insulating layer in a peripheral region, the peripheral region being provided on the first substrate and surrounding the display region.

(16) A display region comprising:
a first substrate;
a light emitting element on the first substrate;
an electroluminescence element in the light emitting element;
a planarizing film on the electroluminescence element, and
a first moisture proof film located at least at a periphery of the electroluminescence element.

(17) The display region according to (16) further comprising a second moisture proof film is in-between a protective film and the planarizing film.

(18) The display region according to (17) further comprising a third moisture proof film is in-between the planarizing film and a protective film.

(19) The display region according to (16) further comprising a separation groove in a seal section.

(20) The display region according to (19) wherein the separation grove is filled with the first moisture proof film.

(21) The display region according to (19) wherein the inner surfaces of the separation grove are lined with a metal film.

(22) A display region comprising:
a substrate;
a light emitting element on the substrate;
an electroluminescence layer in the light emitting element;
a seal substrate above the light emitting layer;
a seal section between the seal substrate and the substrate; and
a first separation groove in the seal section.

(23) The display region according to (22) wherein the first separation groove is filled with at least a portion of the seal section.

(24) The display region according to (22) wherein the inner surfaces of the first separation groove are lined with a metal film.

(25) The display region according to (23) further comprising a second separation groove in the seal section.

(26) The display region according to (25) wherein the inner surfaces of the second separation groove are lined with a metal film.

(27) The display region according to (22) wherein a moisture proof film extends from an end face of the seal substrate to an end face of the seal substrate.

(28) The display region according to (27) wherein the moisture proof film comprises an insulating resin having high moisture resistance.

(29) The display region according to (27) wherein the moisture proof film comprises a resin layer and an inorganic layer.

(30) The display region according to (27) wherein the moisture proof film is a glass layer.

(31) A display region comprising:
a first substrate;
a second substrate above the first substrate;
a light emitting element in-between the first substrate and the second substrate;
an electroluminescence element in the light emitting element;
a planarizing film on the electroluminescence element, and
a moisture proof film extending from an end of the second substrate to an end of the first substrate.

(32) The display region according to (31) wherein the moisture proof film comprises a resin layer an and inorganic layer.

(33) The display region according to (31) wherein the moisture proof film is a glass layer.

(34) A display unit comprising:
a display region;
a peripheral region at a periphery of the display region; and
a first moisture proof film located at least at a periphery of the peripheral region,
wherein,
the display region comprises (i) a pixel circuit layer, (ii) a first insulating layer on the pixel circuit layer, and (iii) a light emitting element on the first insulating layer, and
at least a part of the first moisture proof film covers at least a portion of the first insulating layer.

(35) The display unit according to (34) further comprising a second insulating layer on the first insulating layer, the second insulating film outlining a light emission region.

(36) The display unit according to (34) wherein the first moisture proof film covers the first insulating layer from the display region to the peripheral region.

(37) The display unit according to (34) further comprising a second moisture proof film between the first insulating layer and the second insulating layer.

The present disclosure contains subject matter related to that disclosed in Japanese Priority Patent Application JP 2012-170618 filed in the Japan Patent Office on Jul. 31, 2012 and Japanese Priority Patent Application JP 2012-176507 filed in the Japan Patent Office on Aug. 8, 2012, the entire contents of each of which is hereby incorporated by reference.

It should be understood by those skilled in the art that various modifications, combinations, sub-combinations and alterations may occur depending on design requirements and other factors insofar as they are within the scope of the appended claims or the equivalents thereof.

REFERENCES SIGNS LIST 10W white organic EL element
11 base
111 substrate
112 pixel-driving-circuit formation layer
12 light-emitting element formation layer
13 first electrode layer
14 organic layer
14A hole injection layer
14B hole transport layer
14C luminous layer
14D electron transport layer
16 second electrode layer 17, 25, 26, 29, 34, 35 moisture-proof film
18 filling layer
19 sealing substrate
20 light-emitting section
23 seal section
24 aperture-defining insulating film
124 contact section
27 separation groove
28 metal film
110A display region
110B peripheral region
120 signal-line driving circuit
120A signal line
130 scanning-line driving circuit
130A scanning line
140 pixel driving circuit
217 protective film
218 planarizing film
Cs capacitor (a retention capacitor)
Tr1 drive transistor
Tr2 write transistor

The invention claimed is:

1. A display unit comprising:
    a first substrate;
    a plurality of light-emitting elements disposed in a display region, and each including a luminous layer, the display region being located on the first substrate;
    a first inorganic layer provided in a first level between the first substrate and the luminous layers of the respective light-emitting elements;
    a second inorganic layer that covers the luminous layers of the respective light-emitting elements;
    a third inorganic layer provided in a second level between the first inorganic layer and the second inorganic layer;
    a first organic layer disposed in a region outside of the display region, and provided in a third level between the second inorganic layer and the third inorganic layer, the region outside of the display region being located on the first substrate and surrounding the display region, the first organic layer having an outer edge, the outer edge being provided in the region outside of the display region and covered and sealed in the region outside of the display region by the second inorganic layer; and
    a second organic layer disposed in the region outside of the display region, and provided in a fourth level between the first inorganic layer and the third inorganic layer, the second organic layer having an outer edge, the outer edge being provided in the region outside of the display region and covered and sealed in the region outside of the display region by the second inorganic layer,
    wherein,
        the second inorganic layer is in direct contact with the outer edge of the first organic layer and the outer edge of the second organic layer.

2. The display unit according to claim 1, wherein a first distance from the outer edge of the first organic layer to an outer edge of the display region and a second distance from the outer edge of the second organic layer to the outer edge of the display region are different from each other.

3. The display unit according to claim 1, wherein the first inorganic layer comprises an insulating film.

4. The display unit according to claim 1, wherein the first inorganic layer comprises a metal film.

5. The display unit according to claim 1, wherein the second inorganic layer comprises one of an insulating film and a metal film.

6. The display unit according to claim 1, wherein the third inorganic layer comprises an insulating film.

7. The display unit according to claim 1, further comprising a gate insulating film provided on the first substrate, wherein the first inorganic layer is provided on the first substrate.

8. The display unit according to claim 1, wherein the first inorganic layer comprises a moisture-proof film.

9. The display unit according to claim 1, further comprising a third organic layer provided on opposite side of the first organic layer with respect to the second inorganic layer.

10. The display unit according to claim 9, wherein the third organic layer comprises a filling layer.

11. The display unit according to claim 10, wherein the third organic layer comprises a bonding layer.

12. The display unit according to claim 9, further comprising a second substrate provided on opposite side of the first organic layer with respect to the third organic layer.

13. The display unit according to claim 12, wherein the second substrate includes a transparent material.

14. A display unit comprising:
    a first substrate;
    a plurality of light-emitting elements disposed in a display region, and each including a luminous layer, the display region being located on the first substrate;
    a first inorganic layer provided in a first level between the first substrate and the luminous layers of the respective light-emitting elements;
    a second inorganic layer that covers the luminous layers of the respective light-emitting elements;
    a third inorganic layer provided in a second level between the first inorganic layer and the second inorganic layer;
    a first organic layer disposed in a region outside of the display region, and provided in a third level between the second inorganic layer and the third inorganic layer, the region outside of the display region being located on the first substrate and surrounding the display region, the first organic layer having an outer edge, the outer edge being provided in the region outside of the display region and covered in the region outside of the display region by the second inorganic layer, and being located at a position that is overlapped with the third inorganic layer in a thickness direction; and
    a second organic layer disposed in the region outside of the display region, and provided in a fourth level between the first inorganic layer and the third inorganic layer, the second organic layer having an outer edge, the outer edge being provided in the region outside of the display region and covered in the region outside of the display region by the second inorganic layer, and being located at a position that is overlapped with the first inorganic layer in the thickness direction,
    wherein,
        the second inorganic layer is in direct contact with the outer edge of the first organic layer and the outer edge of the second organic layer.

15. The display unit according to claim 14, wherein:
    the outer edge of the first organic layer is covered and sealed in the region outside of the display region by the second inorganic layer, and
    the outer edge of the second organic layer is covered and sealed in the region outside of the display region by the second inorganic layer.

16. An electronic apparatus with a display unit, the display unit comprising:
- a first substrate;
- a plurality of light-emitting elements disposed in a display region, and each including a luminous layer, the display region being located on the first substrate;
- a first inorganic layer provided in a first level between the first substrate and the luminous layers of the respective light-emitting elements;
- a second inorganic layer that covers the luminous layers of the respective light-emitting elements;
- a third inorganic layer provided in a second level between the first inorganic layer and the second inorganic layer;
- a first organic layer disposed in a region outside of the display region, and provided in a third level between the second inorganic layer and the third inorganic layer, the region outside of the display region being located on the first substrate and surrounding the display region, the first organic layer having an outer edge, the outer edge being provided in the region outside of the display region and covered and sealed in the region outside of the display region by the second inorganic layer; and
- a second organic layer disposed in the region outside of the display region, and provided in a fourth level between the first inorganic layer and the third inorganic layer, the second organic layer having an outer edge, the outer edge being provided in the region outside of the display region and covered and sealed in the region outside of the display region by the second inorganic layer,
wherein,
- the second inorganic layer is in direct contact with the outer edge of the first organic layer and the outer edge of the second organic layer.

17. An electronic apparatus with a display unit, the display unit comprising:
- a first substrate;
- a plurality of light-emitting elements disposed in a display region, and each including a luminous layer, the display region being located on the first substrate;
- a first inorganic layer provided in a first level between the first substrate and the luminous layers of the respective light-emitting elements;
- a second inorganic layer that covers the luminous layers of the respective light-emitting elements;
- a third inorganic layer provided in a second level between the first inorganic layer and the second inorganic layer;
- a first organic layer disposed in a region outside of the display region, and provided in a third level between the second inorganic layer and the third inorganic layer, the region outside of the display region being located on the first substrate and surrounding the display region, the first organic layer having an outer edge, the outer edge being provided in the region outside of the display region and covered in the region outside of the display region by the second inorganic layer, and being located at a position that is overlapped with the third inorganic layer in a thickness direction; and
- a second organic layer disposed in the region outside of the display region, and provided in a fourth level between the first inorganic layer and the third inorganic layer, the second organic layer having an outer edge, the outer edge being provided in the region outside of the display region and covered in the region outside of the display region by the second inorganic layer, and being located at a position that is overlapped with the first inorganic layer in the thickness direction,
wherein,
- the second inorganic layer is in direct contact with the outer edge of the first organic layer and the outer edge of the second organic layer.

18. The electronic apparatus according to claim 17, wherein:
- the outer edge of the first organic layer is covered and sealed in the region outside of the display region by the second inorganic layer, and
- the outer edge of the second organic layer is covered and sealed in the region outside of the display region by the second inorganic layer.

* * * * *